(12) United States Patent
Turchin et al.

(10) Patent No.: US 10,082,839 B1
(45) Date of Patent: Sep. 25, 2018

(54) FLEXIBLE INFORMATION HANDLING SYSTEM DISPLAY HINGE AND RAMP SUPPORT STRUCTURE

(71) Applicant: Dell Products L.P., Round Rock, TX (US)

(72) Inventors: Kevin M. Turchin, Cedar Park, TX (US); Gerald R. Pelissier, Mendham, NJ (US); John T. Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/628,835

(22) Filed: Jun. 21, 2017

(51) Int. Cl.
| | |
|---|---|
| G06F 1/16 | (2006.01) |
| H05K 5/00 | (2006.01) |
| H05K 7/00 | (2006.01) |
| H05K 5/02 | (2006.01) |
| H04M 1/02 | (2006.01) |
| G09F 9/30 | (2006.01) |
| G09F 15/00 | (2006.01) |

(52) U.S. Cl.
CPC .......... *G06F 1/1681* (2013.01); *G06F 1/1652* (2013.01); *G09F 9/301* (2013.01); *H04M 1/0216* (2013.01); *H05K 5/0017* (2013.01); *H05K 5/0226* (2013.01); *G09F 15/0068* (2013.01); *H04M 1/0247* (2013.01)

(58) Field of Classification Search
CPC .... G06F 1/1652; G06F 1/1626; G06F 1/1622; G06F 1/1681
USPC .............. 361/679.21–679.3, 679.55, 679.56; 455/575.1–575.9; 349/56–60
See application file for complete search history.

(56) References Cited

U.S. PATENT DOCUMENTS

| | | | |
|---|---|---|---|
| 7,558,057 B1 | 7/2009 | Naksen et al. | |
| 8,804,349 B2 | 8/2014 | Lee et al. | |
| 9,164,547 B1 | 10/2015 | Kwon et al. | |
| 9,557,771 B2* | 1/2017 | Park | G06F 1/1641 |
| 9,603,271 B2* | 3/2017 | Lee | H05K 5/0017 |
| 9,606,583 B2 | 3/2017 | Ahn et al. | |
| 9,710,033 B2 | 7/2017 | Yamazaki et al. | |
| 9,760,126 B2* | 9/2017 | Shin | G06F 1/1652 |
| 9,848,502 B1* | 12/2017 | Chu | H05K 5/0226 |
| 9,870,031 B2 | 1/2018 | Hsu et al. | |
| 2012/0264489 A1* | 10/2012 | Choi | H04M 1/0216 |
| | | | 455/566 |
| 2012/0307472 A1* | 12/2012 | Bohn | G06F 1/1616 |
| | | | 361/807 |
| 2014/0042293 A1* | 2/2014 | Mok | G06F 1/1652 |
| | | | 248/682 |
| 2014/0111954 A1* | 4/2014 | Lee | G06F 1/1641 |
| | | | 361/749 |

(Continued)

*Primary Examiner* — Anthony Haughton
(74) *Attorney, Agent, or Firm* — Zagorin Cave LLP; Robert W. Holland

(57) ABSTRACT

An information handling system having rotationally coupled housing portions supports a flexible display disposed across the housing portions with a hinge structure that manages flexible display curve radius in a folded configuration. A dual axis synchronized hinge defines the flexible display bend radius by the distance between the hinge axes and by a shape memory alloy planar support fixed in position relative to the hinge. A ramp structure engages a flexible display frame during rotation to an open position to maintain the display frame in a planar configuration.

20 Claims, 29 Drawing Sheets

(56) References Cited

U.S. PATENT DOCUMENTS

| | | | |
|---|---|---|---|
| 2014/0123436 A1 | 5/2014 | Griffin et al. | |
| 2014/0226275 A1* | 8/2014 | Ko | G06F 1/1626 |
| | | | 361/679.27 |
| 2015/0062525 A1 | 3/2015 | Hirakata | |
| 2015/0233162 A1* | 8/2015 | Lee | H04M 1/02 |
| | | | 16/223 |
| 2015/0277506 A1 | 10/2015 | Cheah et al. | |
| 2016/0132076 A1 | 5/2016 | Bitz et al. | |
| 2016/0227645 A1* | 8/2016 | Hampton | G06F 1/1601 |

* cited by examiner

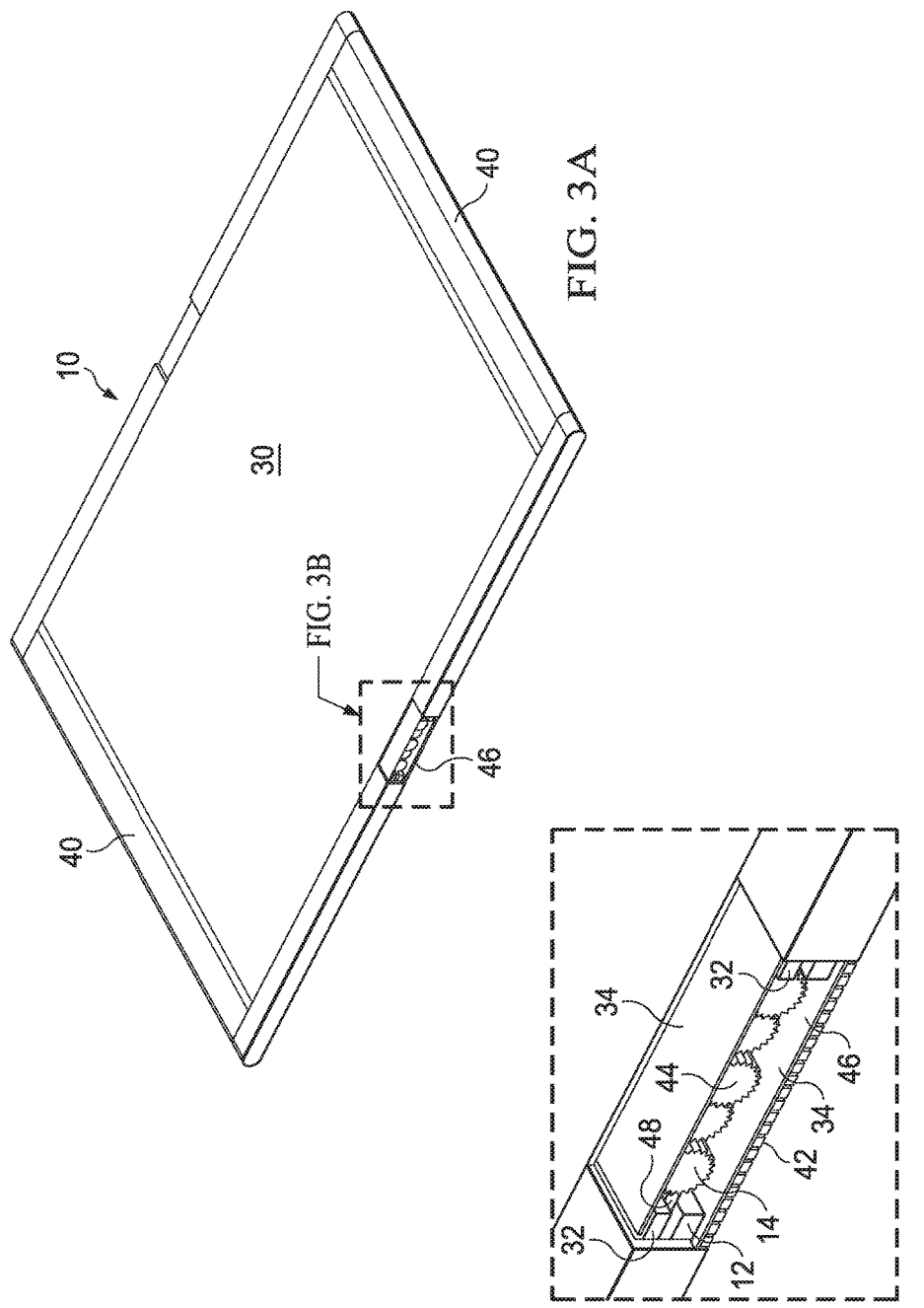

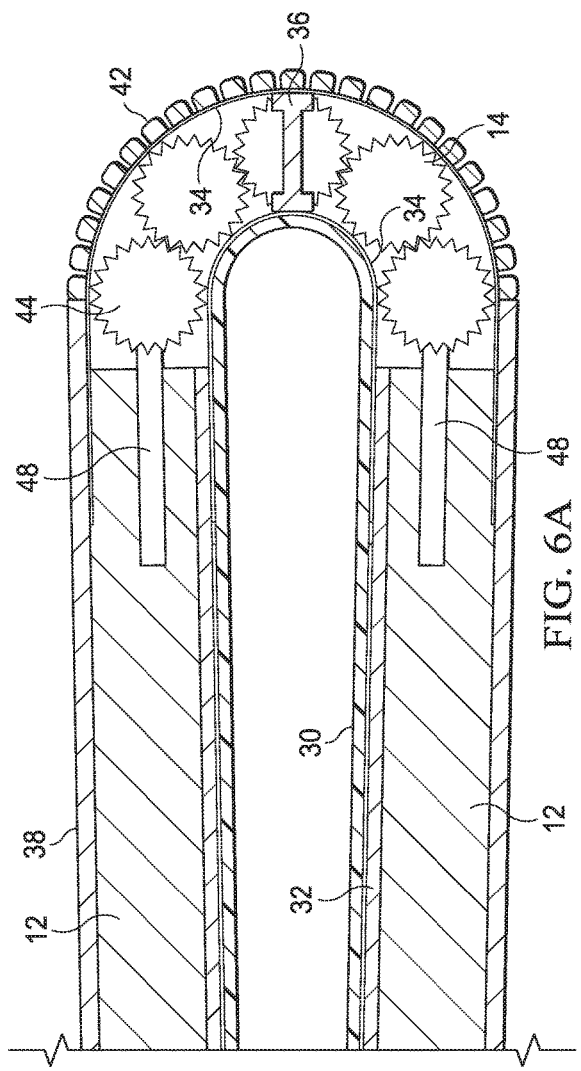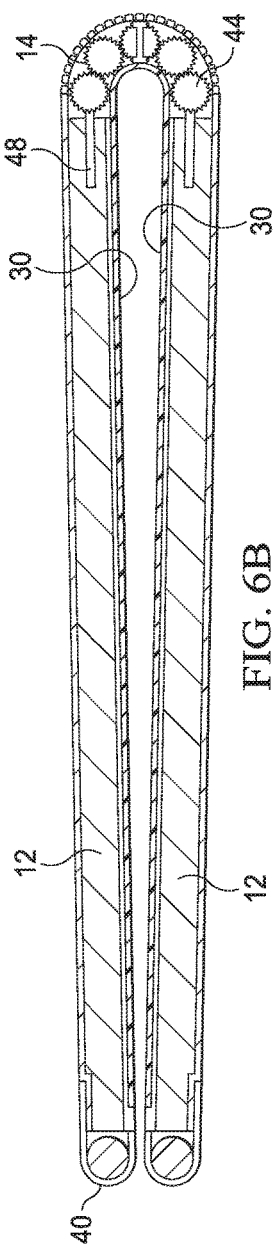

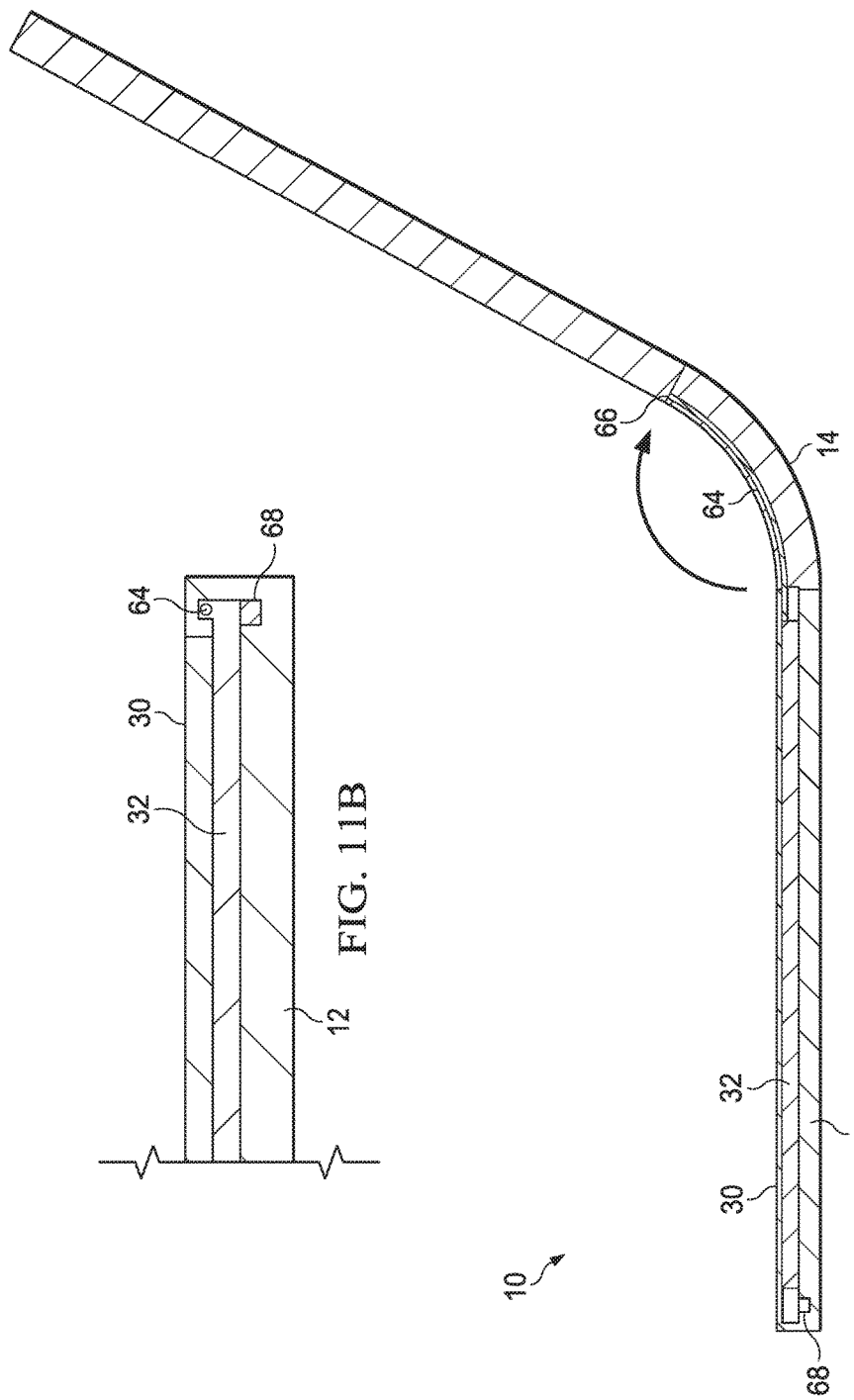

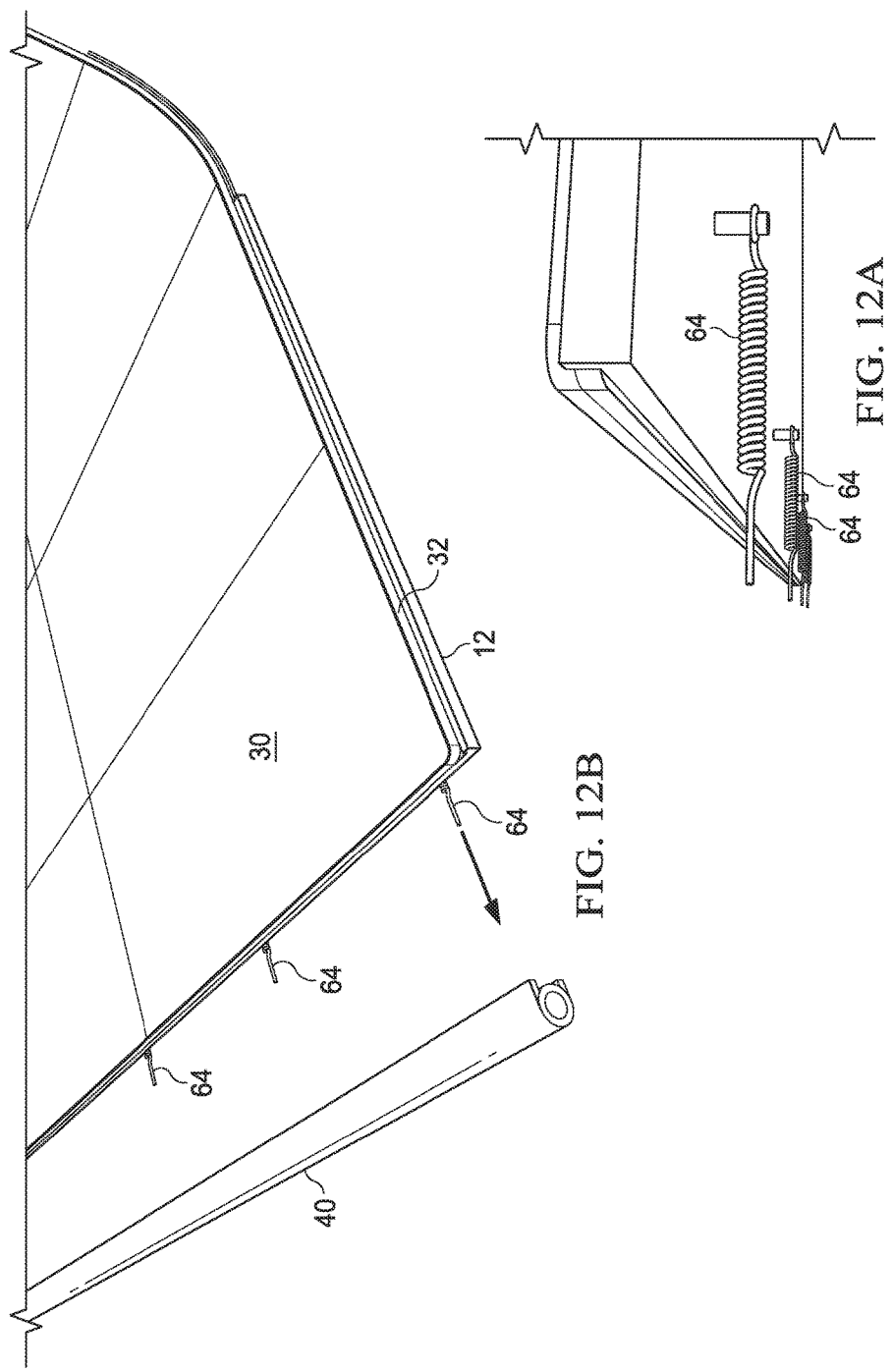

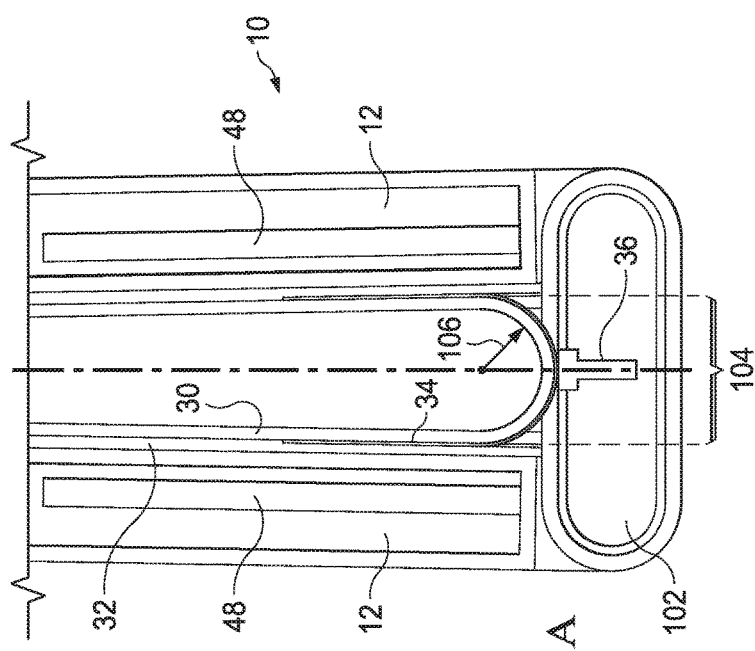
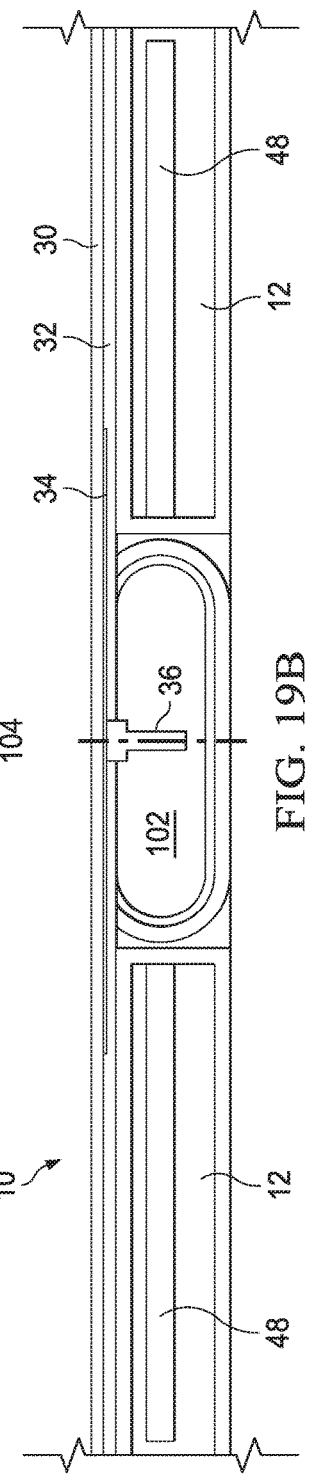
FIG. 19A
FIG. 19B

FLEXIBLE INFORMATION HANDLING SYSTEM DISPLAY HINGE AND RAMP SUPPORT STRUCTURE

CROSS REFERENCE TO RELATED APPLICATIONS

U.S. patent application Ser. No. 15/628,812, entitled "Flexible Information Handling System Display Sliding Frame" by inventors Jung Hwan Hong, Duck Soo Choi, and John T. Morrison, filed on even date herewith, describes exemplary methods and systems and is incorporated by reference in its entirety.

U.S. patent application Ser. No. 15/628,819, entitled "Flexible Information Handling System Display External Hinge Structure" by inventors Jung Hwan Hong, Duck Soo Choi, and John T. Morrison, filed on even date herewith, describes exemplary methods and systems and is incorporated by reference in its entirety.

U.S. patent application Ser. No. 15/628,824, entitled "Dynamic Antenna Orientation with a Flexible Information Handling System Display" by inventors John T. Morrison, Jace W. Files, and Gerald R. Pelissier, filed on even date herewith, describes exemplary methods and systems and is incorporated by reference in its entirety.

U.S. patent application Ser. No. 15/628,841, entitled "Flexible Information Handling System Display" by inventors Jung Hwan Hong, Kevin M. Turchin, John T. Morrison, and Gerald R. Pelissier, filed on even date herewith, describes exemplary methods and systems and is incorporated by reference in its entirety.

BACKGROUND OF THE INVENTION

Field of the Invention

The present invention relates in general to the field of information handling systems, and more particularly to a flexible information handling system display.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems generally integrate input/output (I/O) devices and a power source to provide end users with a mobile computing solution. A typical portable information handling system includes a touchscreen display that presents output as visual images and accepts inputs as touches. Tablet information handling systems are built in planar housings with a touchscreen display that typically acts as the primary I/O device, such as by presenting a virtual keyboard on a display that accepts keyed inputs. Laptop or convertible information handling systems generally integrate a physical input device to aid end user interactions, such as keyboard having physical keys. Often laptop and convertible information handling systems have a housing portion that integrates a display rotationally coupled to a housing portion that integrates a keyboard. Hinges between the housing portions allow an end user to open the housing portions to hold the display in a raised position above the keyboard. The hinges rotate the housing portions to a closed position to provide a more compact footprint for transport of the information handling system. Convertible information handling systems generally rotate through 360 degrees so that the display is available in a tablet mode having the keyboard hidden or folded underneath the display.

One difficulty with tablet information handling systems is that the display size tends to be limited to dimensions that an end user can carry. For example, a liquid crystal display (LCD) typically has a flat surface protected by a glass cover and illuminated with a backlight. Thus the size of the planar housing that holds a tablet information handling system generally has to accept a display that is supported in a fixed footprint. Larger display dimensions tend to present information with more readable fonts and images, however, too large of a display drives a large housing size that reduces portability. More recently, organic light emitting diode (OLED) films have provided an alternative to flat LCDs. OLED films have pixels that include red, green and blue organic material to generate light with a desired mixture. OLED films do not rely upon a backlight to generate visual images so that the structure of an OLED display tends to be thinner than an LCD and also flexible. For example, OLED films curve around and underlying support structure to more effectively use the housing footprint for presenting visual images.

The flexible nature of OLED films provides an option for reducing the size of tablet portable information handling systems. For example, a single OLED film disposed over separate housing portions can fold so that the housing portions rotate to a closed position similar to that of laptop and convertible form factors. One difficulty with folding OLED films is that the curved portion at the fold cannot have too sharp of a bend or the OLED film may break. Another difficulty is that a folding display tends to reside on an outer surface of a housing so that the length of the outer surface varies depending upon fold angle as different distances of movement relate to the screen and other components in separate planes of travel. This delta in distance travel for a display film and other components creates a gap that, if not properly accommodated for, will show waviness, poor electrical and/or optical performance, and damage to the film material. In addition, the gap related to housing support of a folding display tends to create an awkward physical appearance and structures that can catch on external objects. In thin portable systems that have a low Z height, stresses related to folding of a housing can require more robust structural materials, thus adding weight and thickness to the system. Further, components disposed in the housing can have different and unexpected position and interactions. For example, antenna that support wireless communications can have awkward positioning in small form factors.

SUMMARY OF THE INVENTION

Therefore, a need has arisen for a system and method which manages information handling system housing portion movements that bend a flexible display.

A further need exists for a system and method that manages component interactions of information handling systems having a flexible display.

In accordance with the present invention, a system and method are provided which substantially reduce the disadvantages and problems associated with previous methods and systems for managing flexible display movements related to rotationally coupled housing portions of an information handling system. One or more hinges rotationally couple housing portions that rotate relative to each other between a planar configuration and a closed configuration. A flexible display, such as an OLED film disposed across the housing portions and hinge, folds as the housing portions rotate from a planar to closed configuration. A display frame structure interacts with the hinge during rotation of the housing portions to manage flexible display fold radius so that damage does not occur to the flexible display. For example, the display frame structure manages a sliding motion relative to the housing portions as housing portions rotate about the hinge.

More specifically, an information handling system has first and second housing portions rotationally coupled to each other. Processing components integrated in the housing portions process information for presentation as visual images at a flexible OLED display film disposed across the housing portions. A display frame structure holds the OLED display film and provides support to the display film that prevents damage, such as sharp bends or indentations from end user manipulation of the housing portions and end user touches to the display film surface. For example, the display frame structure includes a first display frame slidingly engaged with a first housing portion, a second display frame slidingly engaged with a second housing portion, and a flexible support coupled between the display frames so that the OLED display film has a stationary support surface that extends from the first to the second housing portion and across the hinge. As housing portions rotate between planar and closed configurations, the relative diameter of the housing portion hinge structure and the display frame structure changes. The display frame structure adapts to the changed relative position with the housing portions by sliding relative to the housing portions. Roller assemblies on opposing ends of the housing portions manage sliding motion of display frames relative to housing portions. In one embodiment, a biasing device associated with the roller assembly and/or other display frame structure provides a bias to the display frame that reduces force applied to the display film during rotational movement of the housing portions. In one embodiment, antenna integrate in the roller assemblies and change their orientation based upon relative rotational positions of the housing portions to provide improved wireless communications.

In various alternative embodiments, different types of hinge assemblies provide desired flexible display curvature radius management. For example, a synchronized hinge having five interconnected geared portions provide flexible display fold radius management based upon geared portion size. An I beam interconnect bar couples to the flexible support of the display frame structure and the middle hinge portion to maintain the display frame structure in a constant position relative to the center of the hinge. A second flexible support fixedly couples to a bottom portion of the interconnect bar to provide support at the bottom of the hinged housing structure. The flexible support is, for example, a shape metal alloy like nickel titanium or other flexible material like stainless steel. An alternative hinge structure includes a dual axis synchronized hinge that defines curvature radius based upon distance between the axes. In order to obtain a tighter closed configuration having closed housing portions in close proximity, each display frame may include a ramp structure and flexible portion that provides an additional film curve in each display frame opposite the curve of the display film at the hinge. Another alternative hinge structure has plural link elements interacting between adjacent curved front faces and curved cavities. The link elements couple to each other with coupling elements that include a pivot point location behind the rotational arc of the curved front face. Coupling elements that pivot behind rotationally engaged link elements limit rotation about the face and cavity interface to provide a managed hinge curve within display film fold constraints.

The present invention provides a number of important technical advantages. One example of an important technical advantage is that an information handling system disposes a flexible display across rotationally coupled housing portions that rotate between planar and closed configurations and have a flexible display disposed across both portions and their hinge structure. A display frame structure manages the fold of the flexible display to keep the display film within fold radius constraints. End users may conveniently fold housing portions relative to each other to arrange the display film in different orientations between a closed configuration and a planar configuration. The hinge structures manage fold radius and display frame structure position during rotational movements and minimize housing size to provide a convenient portable information handling system for end users.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 3A, 3B, and 3C depict an assembled information handling system respectively with a top perspective view of a planar configuration, a close up perspective side view of the hinge assembly in the planar configuration and a perspective side view of the hinge assembly in a closed configuration;

FIGS. 6A and 6B depict a side cutaway view of an example embodiment of an information handling system having a flexible display folded about a hinge holding housing portions in a closed position;

FIGS. 11A and 11B depict side cutaway views of an example embodiment that biases display frame movement in response to rotation about a hinge;

FIGS. 12A and 12B depict side lower and upper perspective views respectively of an information handling system with multiple biasing devices;

FIGS. 19A and 19B depict rotation of information handling system housing portions between closed and planar configurations about a dual axis hinge:

DETAILED DESCRIPTION

An information handling system supports a flexible display over rotationally couple housing portions to fold the display as the housing portions rotate relative to each other. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
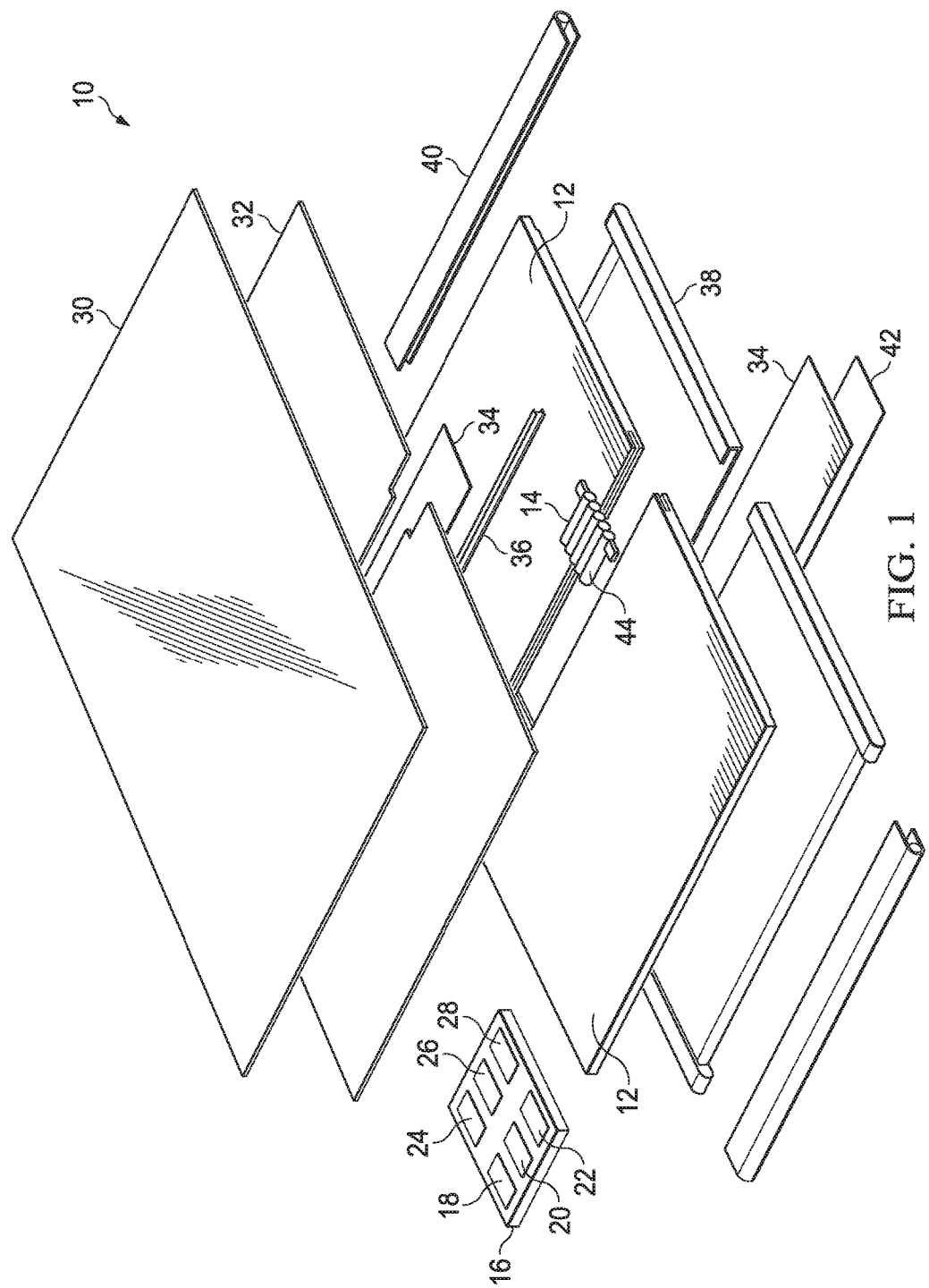
FIG. 1 depicts an expanded perspective view of an information handling system having a flexible display disposed over rotationally couple housing portions.

Referring now to FIG. 1, an expanded perspective view of an information handling system 10 depicts a flexible display 30 disposed over rotationally couple housing portions 12. In the example embodiment, information handling system 10 processes information with processing components disposed in one or more of housing portions 12 that rotationally couple about one or more hinges 14. For instance, a motherboard 16 couples to a housing portion 12 interior to support communications between processing components. A central processing unit (CPU) 18 couples to motherboard 16 and executes instructions that process information stored in random access memory (RAM) 20. Persistent storage, such as a solid state drive (SSD) 22 stores instructions and information when information handling system 10 powers down and provides the information to CPU 18 and RAM 20 on power up. For instance, SSD 22 stores an operating system that coordinates interaction of the processing components and applications that execute over the operating system that create and modify information. A chipset 24 includes a variety of processor and controller components that execute embedded code to support end user interactions and system management. For instance, an embedded controller manages power and interactions between input/output (I/O) devices and CPU 18. As another example a graphics processor unit (GPU) 26 processes visual information in cooperation with CPU 18 to generate pixel values that define visual images for presentation on a display. Similarly, a wireless network interface card (WNIC) provides wireless communications through radio signals communicated with external devices, such as an external wireless local area network (WLAN) or wireless wide area network (WWAN).

In the example embodiment, visual information is presented as visual images with an organic light emitting diode (OLED) film display 30 disposed over housing portions 12. OLED display film 30 is a flexible display film that folds as housing portions 12 rotate about hinges 14 from the planar configuration depicted to a folded configuration, such as a closed position. In order to support OLED film display 30 during folding, OLED film 30 is coupled to a display frame structure having first and second display frames 32 coupled together with a flexible support 34 disposed between display frames 32 at the location of the fold of OLED film display 30. Flexible support 34 is a thin sheet of shape memory alloy material set to a planar configuration, such as a nickel titanium alloy material that is treated to have shape memory response. Alternatively flexible support 34 is a thin sheet of metal, plastic, composite, or other material that manages fold shape, such as stainless steel. During rotation of housing portions 12, flexible support 34 manages the fold radius or OLED display film 30 so that the film does not overstress resulting in damage. The display frame structure remains in a constant position relative to OLED display film 30 during rotation of housing portions 12 to provide support that maintains the integrity of OLED display film 30.

Rotation of housing portions 12 from planar to folded configurations changes the distance about the inner and outer diameters relative to each other. In the example embodiment, OLED display film 30 folds from the planar configuration depicted to a closed position having OLED display film 30 folded to rest proximate each other sandwiched between housing portions 12. In alternative embodiments, OLED display film 30 may rotate in the opposite direction so that display film 30 is exposed at the outer periphery of information handling system 10. In either case, the periphery of the outer exposed portion of information handling system 10 will have a greater distance than the periphery of the inner portion of information handling system 10. To adapt to this change in relative position of inner and outer surfaces of information handling system 10, the display frame structure slides relative to housing portions 12 during rotation of housing portions 12.

In the example embodiment, housing portions 12 each fixedly couple to hinge 14 and provide a sliding interface with display frames 32. The display frame structure maintains a center position between housing portions 12 by fixedly coupling to hinge 14 at the center of rotation of hinge 14. In the example embodiment, flexible support 34 fixedly couples to an interconnect bar 36 that in turn fixedly couples to a center of first and second hinges 14 disposed at opposing ends of housing portions 12. For example, interconnect bar 36 has an I beam shape with an upper surface of the 1 beam welded to the bottom surface of flexible support 34 and each end inserted into a fitting of hinge 14. In the example embodiment, hinge 14 has five interconnected portions that rotate relative to each other, such as five geared portions that transfer rotational movement between each other in a synchronized movement. By including an odd number of hinge portions, the center of the rotation is based in a middle hinge portion position so that coupling of interconnect bar 36 to the middle portion maintains a fold defined about the center of OLED display film 30.

In the example embodiment, an outer housing case 38 covers the bottom sides of housing portions 12 and a roller edge cover 40 couples to each of opposing ends of housing portions 12 to define the housing structure. Another flexible support 34 provides fold radius definition at the bottom of the housing structure, such as with a similar or the same material as the flexible support 34 used proximate OLED display film 30. An outer metal bar cover 42 provides decorative and protective cover that folds in cooperation with flexible support 34. In one example embodiment, interconnect bar 36 fixedly couples to both the upper and lower flexible supports 34 to maintain both flexible supports 34 in constant relative position to hinges 14. Roller edge cover 40 couples with opposing ends of the display frame structure to manage sliding motion of the display frames 32 relative to housing portions 12 during rotation. In various embodiments, such as those described herein, various display frame, housing, hinge and flexible structures may be used to manage folding of OLED display film 30 so that a minimum radius is maintained that prevents display frame damage.

Figure 2A:
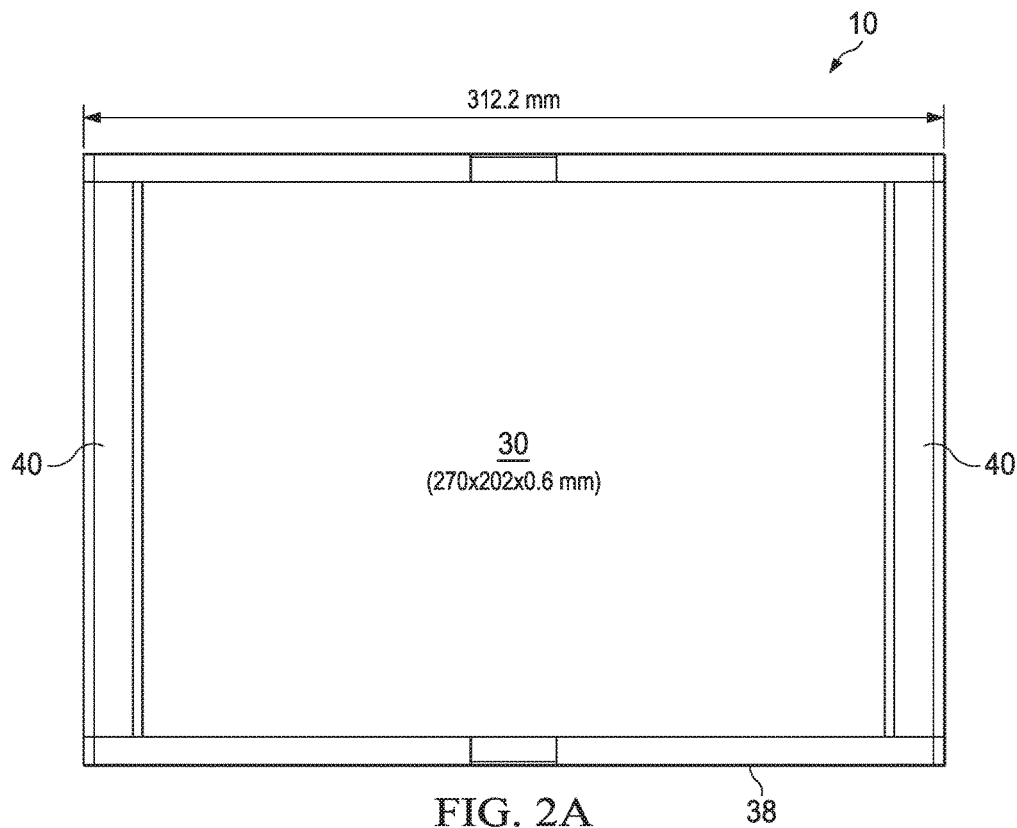
FIGS. 2A, 2B and 2C depict an assembled information handling system respectively with a top view of a planar configuration, a side view of a planar configuration and a side view of a closed configuration.
Figure 2B:
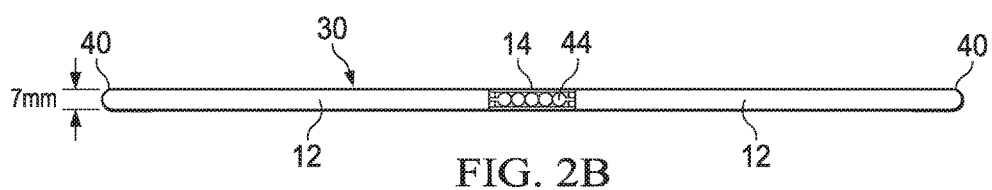
Figure 2C:
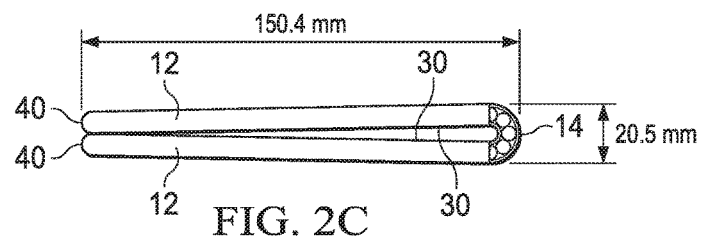

Referring now to FIGS. 2A, 2B and 2C, an assembled information handling system 10 is depicted respectively with a top view of a planar configuration, a side view of a planar configuration and a side view of a closed configuration. FIG. 2A illustrates an example embodiment having example dimensions that provide a folded radius with adequate curvature to avoid damage to OLED display film 30. In the planar configuration, OLED display film 30 is disposed in a center position relative to roller edge covers 40. As illustrated by FIG. 2B, the center of display 30 is fixed to a center of hinge 14 so that display 30 remains centered relative to hinge 14 during rotation of housing portions 12. The odd number of five geared rotational hinge elements 44 provides a third central hinge element 44 about which the other hinge elements rotate. In addition, five hinge elements 44 introduce a desirable and manageable fold radius of display 30 without a "snake" effect that may occur if seven or more hinge elements are present. FIG. 2C illustrates a closed configuration in which housing portions 12 are rotated relative to each other to a closed position having display 30 facing itself following a fold about hinge 14. The total height of housing portions 12 distal hinge 14 is 14 mm compared with a height at hinge 14 of 20.5 mm. The additional spacing around hinge 14 provides a graduated curve radius for display 30 that prevents overstress of OLED film material in display 30. The desired curve radius is managed through a combination of hinge selection, such as the number and size of hinge elements 44, and the characteristics of flexible support 34, such as the treatment and thickness of shape memory alloy that supports OLED display film 30. The example embodiment depicts example dimensions and are not intended to limit the scope of the disclosure, but rather to illustrate one example radius.

Figure 3C:
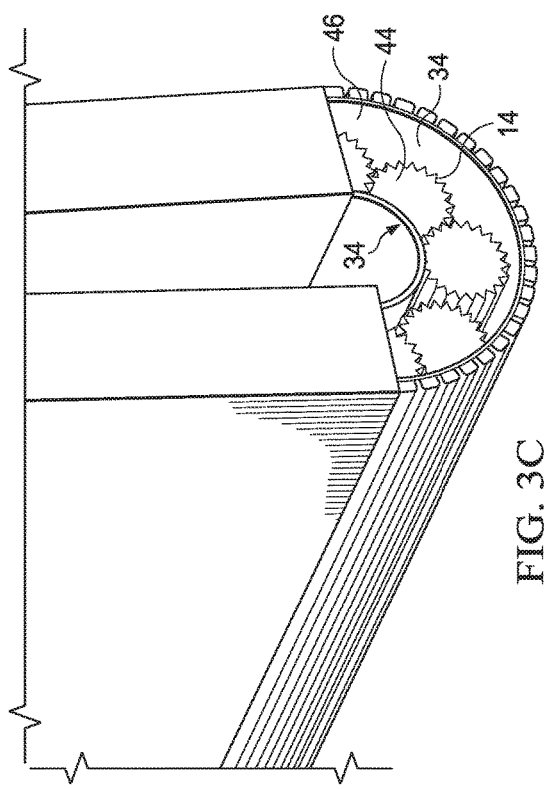

Referring now to FIGS. 3A, 3B, and 3C, an assembled information handling system 10 is depicted respectively with a top perspective view of a planar configuration, a close up perspective side view of the hinge assembly 46 in the planar configuration and a perspective side view of the hinge assembly 46 in a closed configuration. Hinge 14 couples an axle 48 at each end to each housing portion 12 with five hinge elements 44 interacting through geared connections. Hinge assembly 46 in effect rotates housing portions 12 in synchronous motion about the central hinge element 44 to provide a radius of hinge assembly 46 as a whole that prevents overstress of OLED display film 30. Flexible supports 34 are disposed on top and bottom of hinge 14 to provide an even curvature for display film 30 and metal bar cover 42 on the bottom of information handling system 10. FIG. 3C illustrates the curvature radius about display film 30 at inner circumference formed as housing portions 12 rotate to a closed position. As is set forth in greater detail below, OLED display film 34 remains in a fixed position relative to the flexible support 34 between it and hinge 14, however the display frame assembly that includes display 30, flexible support 34 and display frames 32 slide relative to housing portions 12 as housing potions 12 rotate relative to each other.

Figure 4:
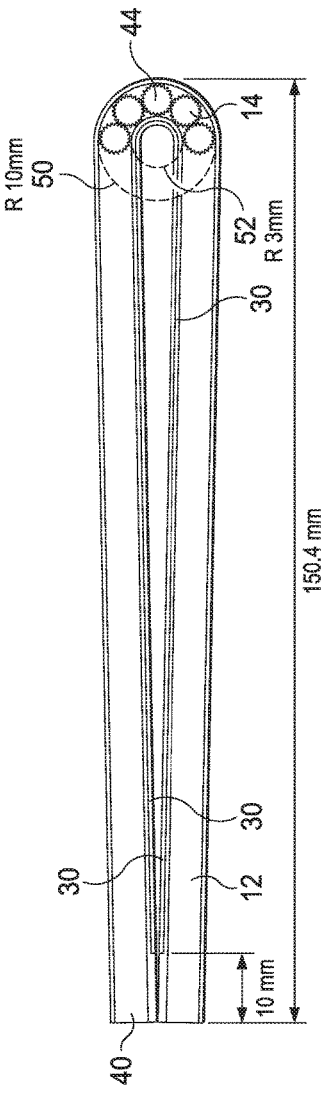
FIG. 4 depicts an example information handling system embodiment exemplary dimensions for display radius in a closed configuration.

Referring now to FIG. 4, an example information handling system embodiment depicts exemplary dimensions for display radius in a closed configuration. The five element 44 hinge 14 provides an outer radius 50 having 10 mm and an inner radius 52 having 3 mm. In various embodiments, different sized display film curvatures may be desired and achieved with alterations in hinge and flexible support configurations. At the opposing end of housings 12 to hinge 14, roller edge cover 40 adjust to allow sliding motion of the display frame structure so that display film 30 is 10 mm from the end housing portions 12. As housing portions 12 rotate to the closed position, the smaller inner radius 52 relative to the outer radius 50 results in sliding motion of display film 30 towards roller edge cover 40. The relative positions may be discerned as an example by comparison to the example in FIGS. 2A, 2B, and 2C. Again, the exact dimensions are provided as a guide for a particular embodiment to illustrate an assembly having an acceptable display curvature and not intended to limit the scope of the present disclosure.

Figure 5:
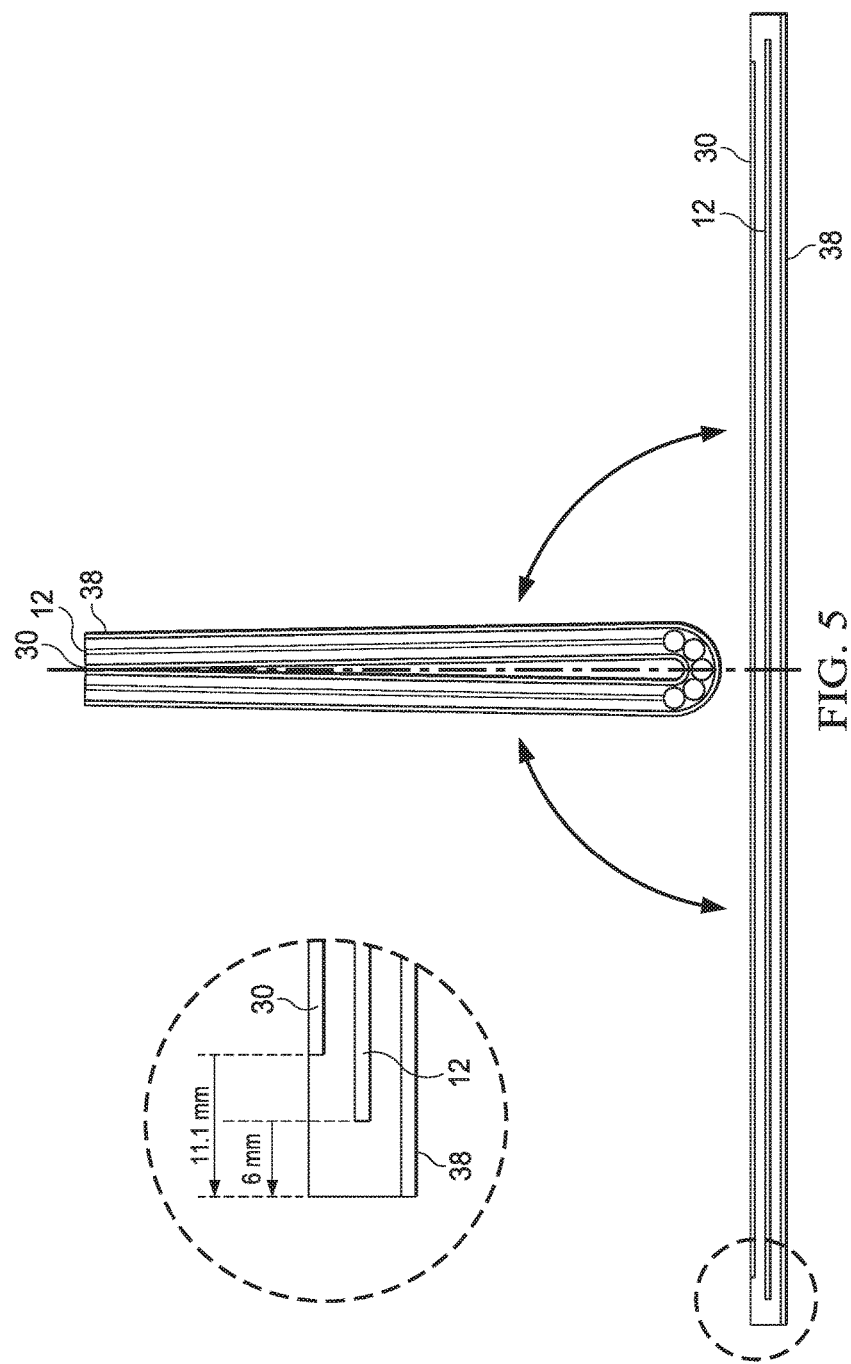
FIG. 5 depicts relative motion of a display and a housing for planar and closed positions.

Referring now to FIG. 5, relative motion of a display and a housing are depicted for planar and closed positions. In the example embodiment, in the closed position, display 30, housing portions 12 and case 38 align at the end opposite hinge 14. The total length of the outer perimeter case 38 is 312.2 mm, of the hinge and housing portions is 300.3 mm, and of the display 30 and display frame structure is 290 mm. In the planar configuration, display 30 has slid 5 mm relative to housing portion 12 and 1 mm relative external case 38. The amount of relative motion in different example embodiments depends upon the relationship of housing portion movements that define the inner and outer radius in the closed configuration. Thicker housing structures and greater curvatures about the hinge structure result in larger relative motion of the display frame structure and housing portions.

Referring now to FIGS. 6A and 6B, a side cutaway view depicts an example embodiment of an information handling system 10 having a flexible display 30 folded about a hinge 14 holding housing portions in a closed position. As illustrated by FIG. 6B, roller assembly 40 has managed movement of display 30 and display frame 32 relative to housing portions 12 in the closed position to adjust for the smaller diameter about hinge 14 that display 30 experiences relative to housing portions 12. Hinge 14 couples to each housing portion 12 with an axle 48 that extends from the outer hinge elements 44. A total of five hinge elements 44 interact through geared interfaces that provide synchronized movement of housing portions 12 during rotation. The use of exactly five hinge elements 44 in the example embodiment provides synchronized motion without a snake effect in hinge 14. Further, five hinge elements 44 provide an inner radius that offers an acceptable fold radius for display film 30. In various embodiments, the curve radius may be adjusted by selection of different sized hinge elements 44. In addition, flexible support 34 provides structure beneath display film 30 that cooperates with the curvature of hinge 14 to provide a graduated transition across display film 30. For example, flexible support 34 fixedly couples with display frames 32 so that display film 30 is maintained in a supported condition. Flexible support 34 fixedly couples to an "I" shaped interconnect bar 36 that is in turn fixedly coupled to the center third hinge element 44 and the outer diameter flexible support 34. In this manner, display film 30 maintains a center position at information handling system 10 while display frame 32 and flexible support 34 slide relative to housing portions 12.

Figure 7:
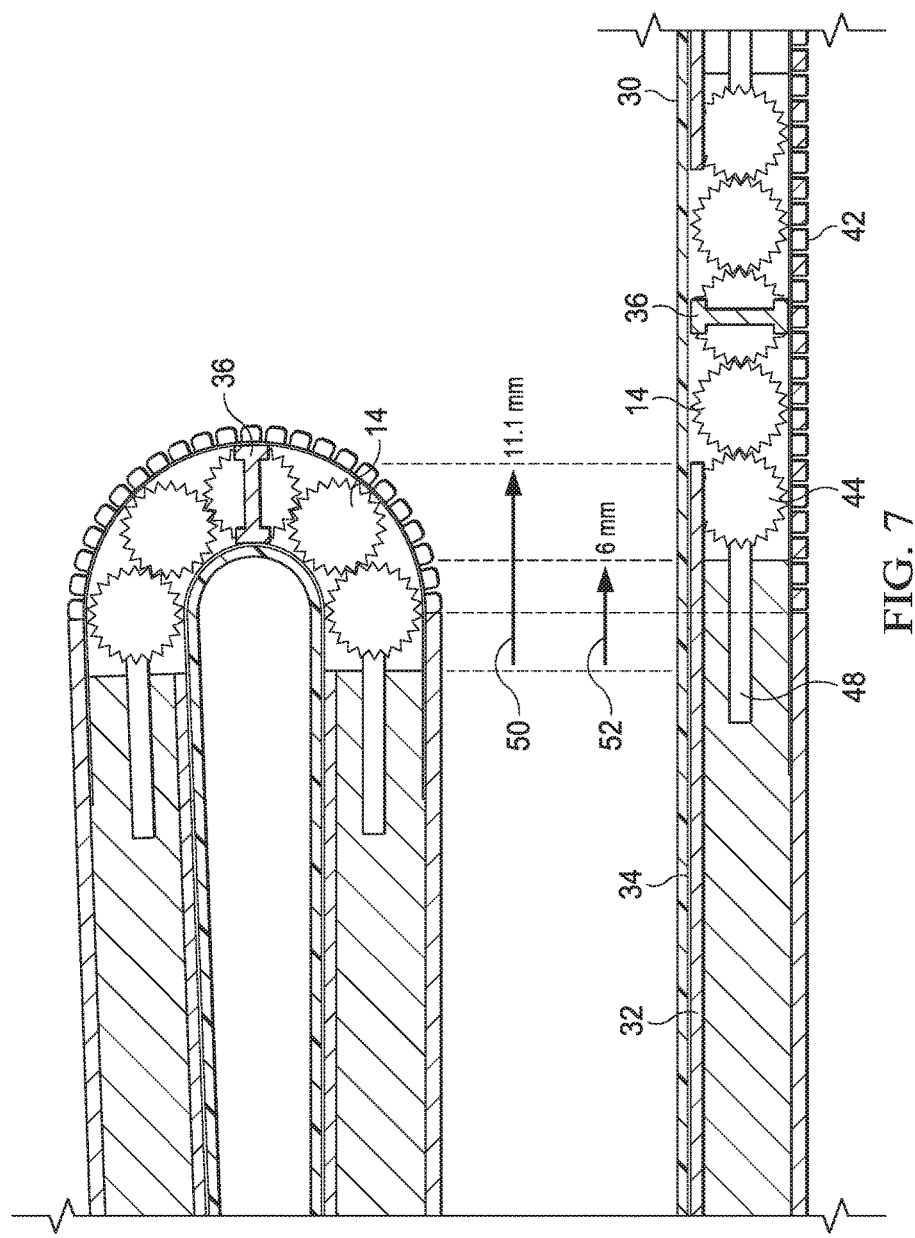
FIG. 7 depicts folded and planar configurations of an information handling system having a sliding motion of a display frame structure relative to rotationally coupled housing portions.

Referring now to FIG. 7, folded and planar configurations of information handling system 10 depict relative sliding motion of a display frame 32 structure relative to rotationally coupled housing portions 12. In the example embodiment, the bottom surface of information handling system remains stationary, as is depicted by the relative position of the metal bar cover 42 in the folded and planar configurations. Housing portion 12 rotates with hinge 14 to slide relative to case 38 by 6 mm, as illustrated by arrow 52. Display frame 32, flexible support 34 and OLED display film 30 slide as a display frame structure relative to case 38 by 11 mm as illustrated by arrow 50. The display frame structure remains fixed in relative position to interconnect bar 36 as hinge 14 rotates to the planar configuration, resulting in sliding motion relative to housing portion 12. Note in the example embodiment that the "I" shape of interconnect bar 36 provides dual opposing end surfaces that offer increased surface area for fixed coupling to opposing flexible supports 34. In various embodiments, interconnect bar 36 may couple with central hinge element 44 at an end or in different relative locations along the length of hinge 14.

Figure 8:
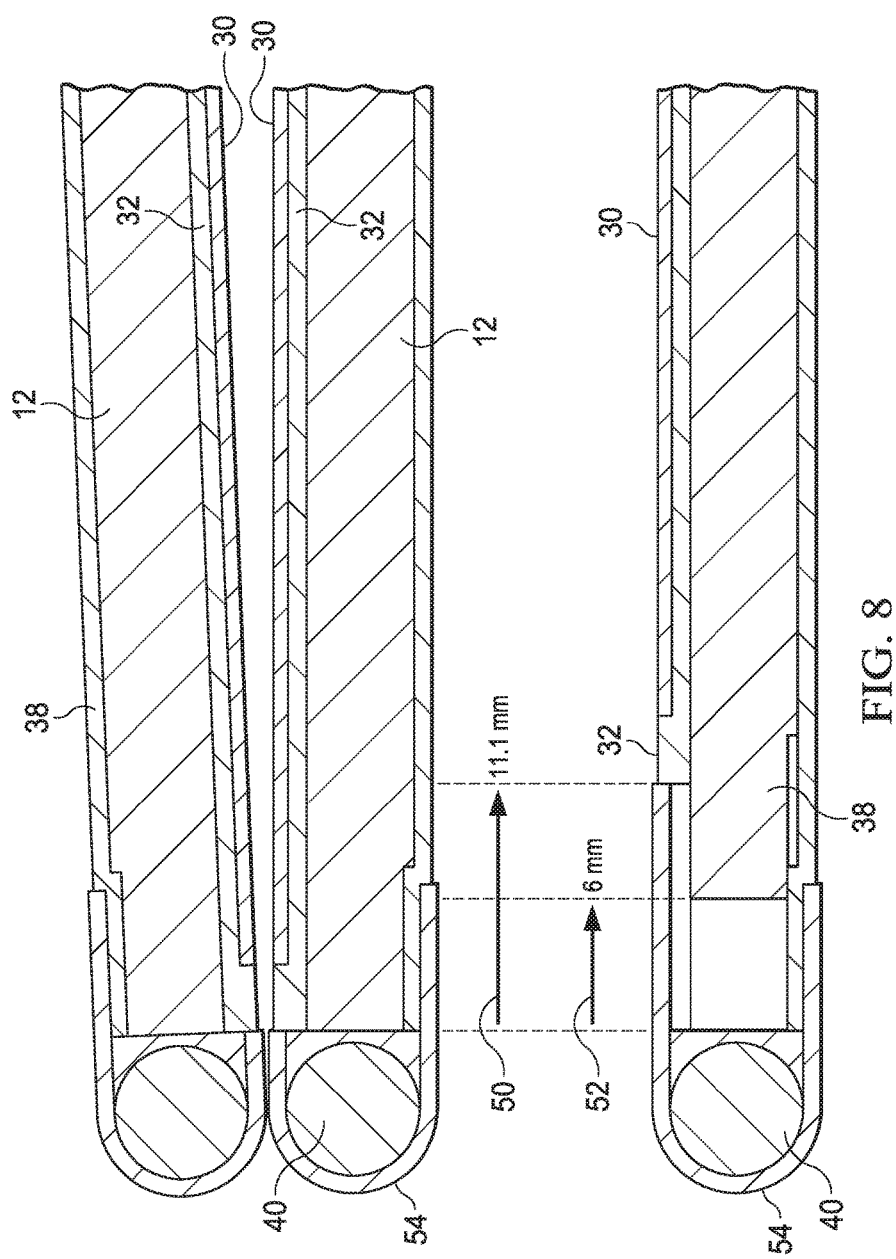
FIG. 8 depicts folded and planar configurations of an information handling system having relative sliding motion of a display frame structure relative to rotationally coupled housing portions at a roller assembly.

Referring now to FIG. 8, folded and planar configurations of information handling system 10 depict relative sliding motion of a display frame 32 structure relative to rotationally coupled housing portions 12 at a roller assembly 40. As is illustrated by arrows 50 and 52, the relative motion of the display frame structure, housing portions 12 and case 38 mirror the motion at hinge 14 depicted in FIG. 7. Roller assembly 40 has a flexible outer cover 54 that moves with rotation of roller 40 to maintain a cohesive surface where roller 40 couples to display frame 32. Upon rotation from the closed configuration to the open configuration, the relative motion of the display frame structure caused by hinge rotation results in sliding of display frame 32 relative to housing portion 12 and case 38. Space within case 38 proximate roller assembly 40 provides room for this relative motion. In various embodiments, friction between the sliding structures may be managed in different ways to maintain structural integrity over use of the system. For example, greased rails or rollers between each sliding portion may provide more consistent movement and reduce the risk of damage from moving parts over time.

Figure 9:
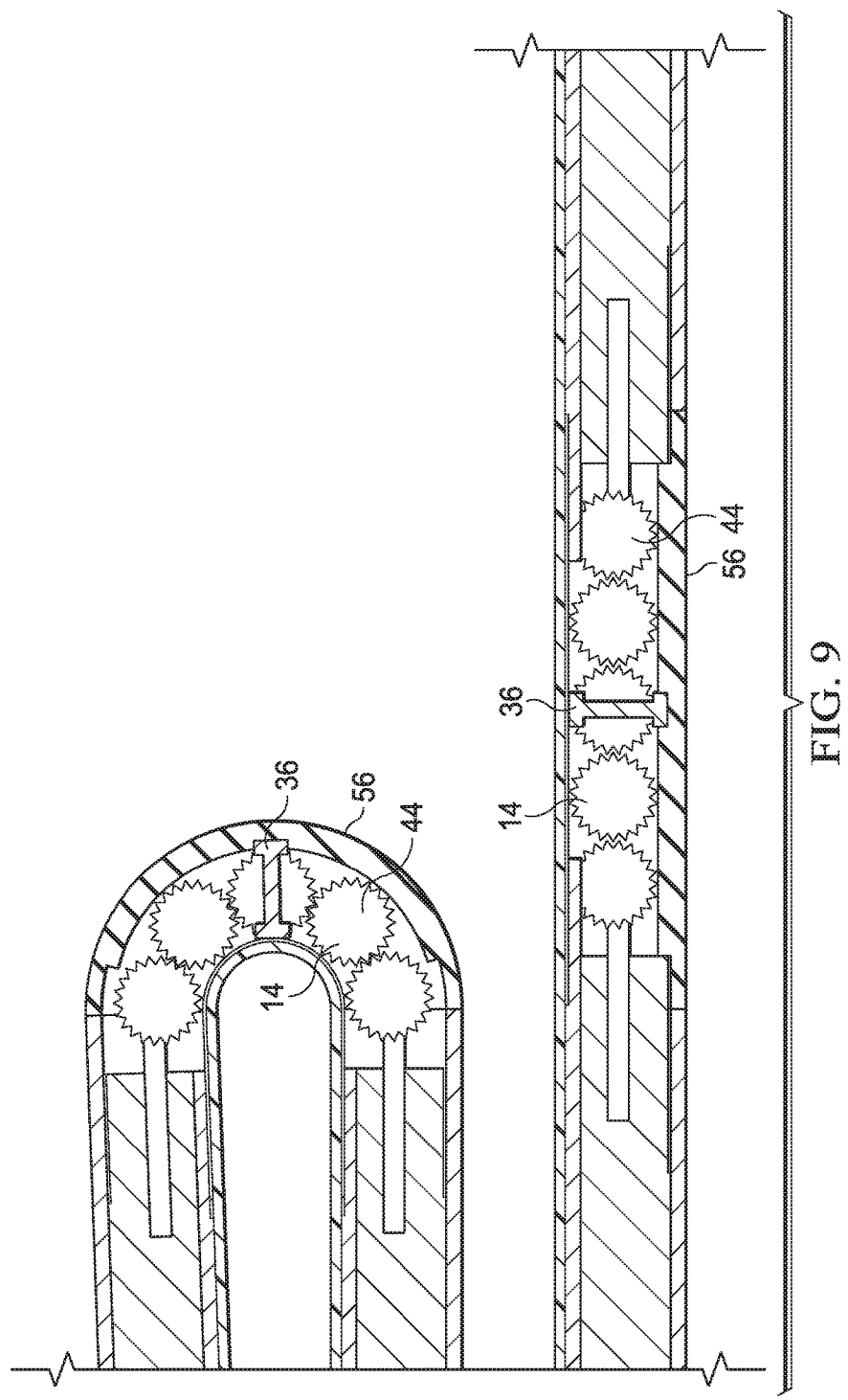
FIG. 9 depicts an alternative embodiment of an information handling system having a flexible hinge cover for adapting to rotational movement of housing portions.

Referring now to FIG. 9, an alternative embodiment of information handling system 10 depicts a flexible hinge cover 56 for adapting to rotational movement of housing portions 12. In the example embodiment, flexible cover 56 is a 1.5 mm thick TPU silicon material that accepts one end of interconnect bar 36. Flexible cover 56 molds to hinge 14 as hinge 14 moves housing portions 12 relative to each other. In the example, flexible material of cover 56 stretches to adapt to relative motion between housing portion 12 and case 38. In various alternative embodiments, case 38 may integrate with housing portion 12 so that only display frame 32 and housing portion 12 slide relative to each other without additional relative sliding motion of a separate case. In such an embodiment, flexible cover 56 stretches in the closed configuration to adapt to the increased outer diameter introduced by folding of the hinge.

Figure 10A:
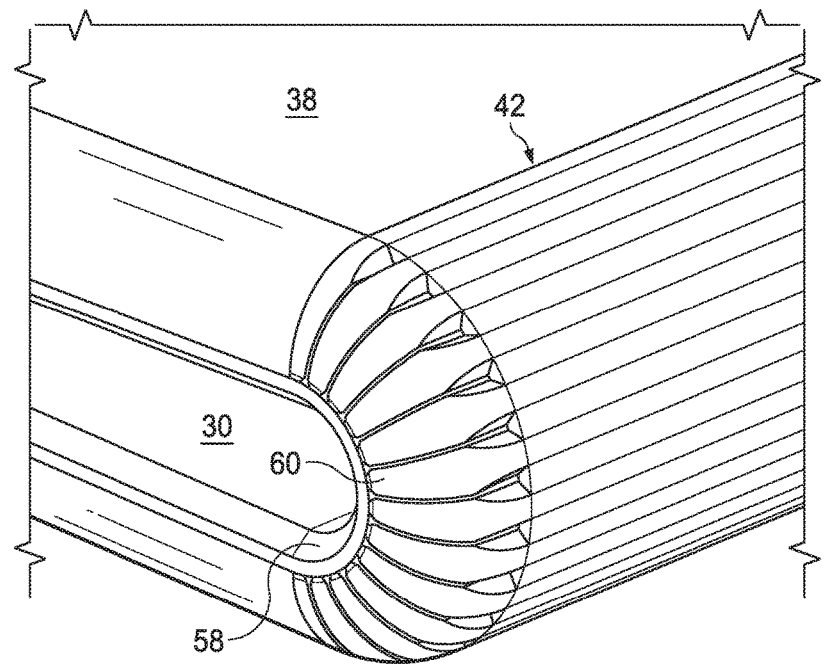
FIGS. 10A through 10F depict the outer bar cover supporting structure in planar and folded configurations.
Figure 10B:
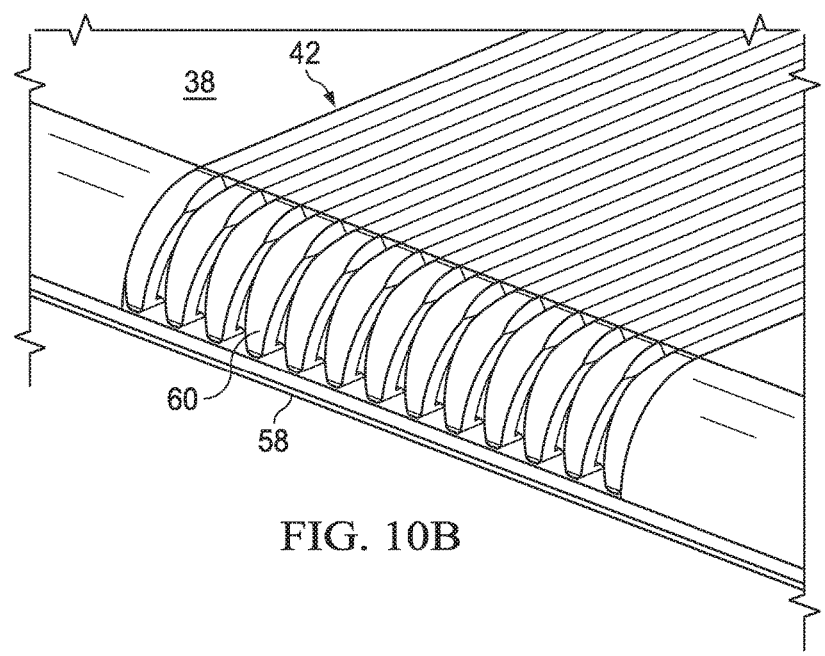
Figure 10C:
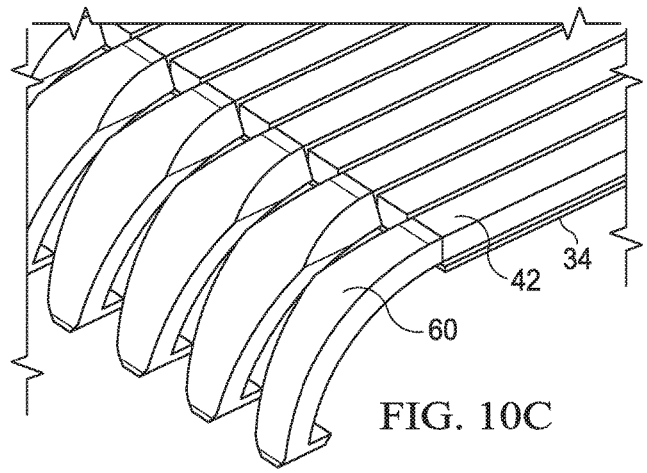
Figure 10D:
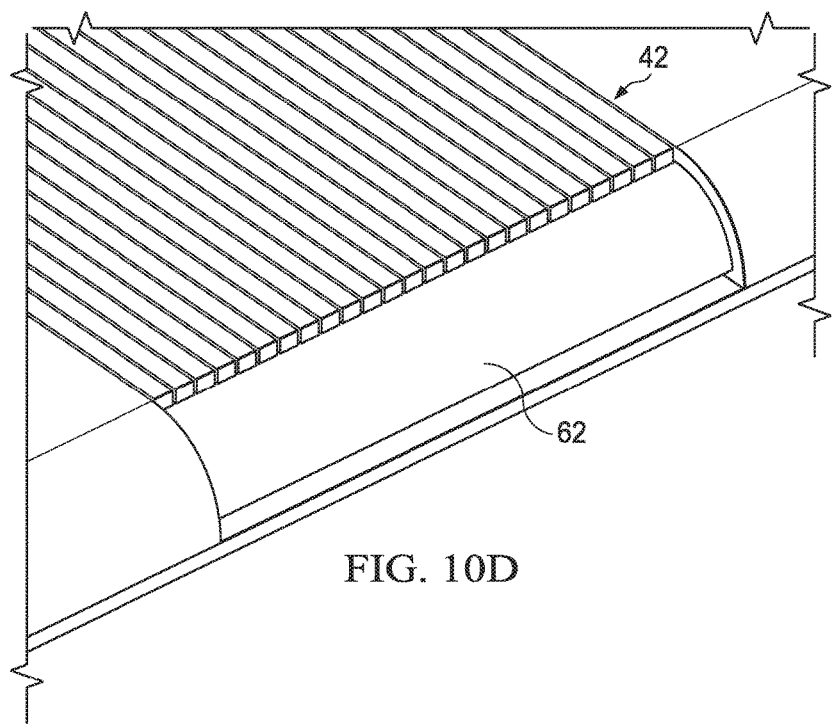
Figure 10E:
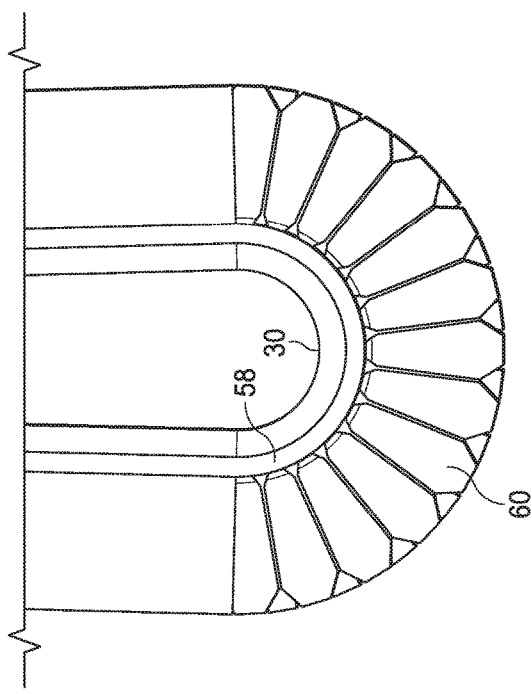
Figure 10F:
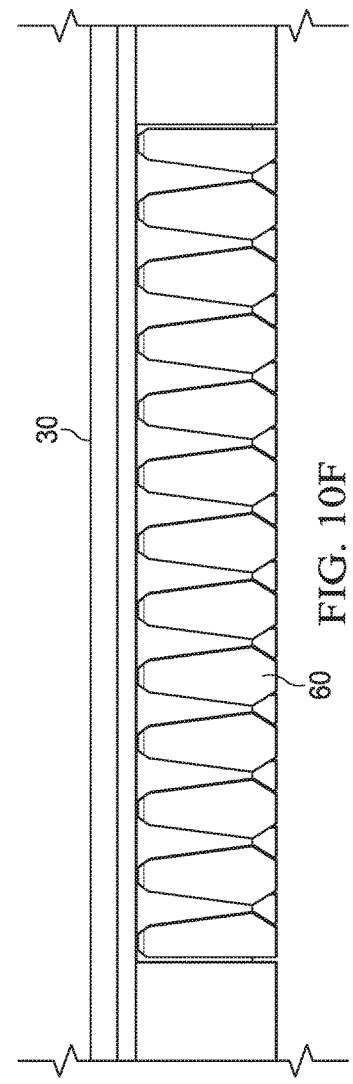

Referring now to FIGS. 10A through 10F, outer bar cover 42 supporting structure is depicted in planar and folded configurations. FIG. 10A depicts information handling system 10 in a folded configuration with bar cover 42 protecting the hinge assembly in a rotated position. A flexible soft frame, such as TPU silicon material, manages the physical intersection of flexible cover 42 and display 30. FIG. 10B depicts information handling system 10 in a planar configuration with side elements 60 expanding at flexible frame 58 to provide a protective cover along the side portion of information handling system 10. FIG. 10C depicts the metal bar structure 42 welded to flexible support 34 to provide a protective outer surface at the bottom of information handling system 10. Side elements 60 extend out from the fixed coupling with flexible support 34 to expand and contract with hinge rotation. FIG. 10D depicts bar cover 42 with side elements 60 removed. An underlying protective flexible material, such as a TPU silicon material, covers hinge 14 to prevent contaminates from entering the hinge structure. FIG. 10E depicts the relationship of side elements 60 in the folded configuration. Side elements 60 have angled side walls that close spacing between side elements 60, such as by aligning with the center of rotation of the hinges. FIG. 10F depicts the planar configuration where side elements 60 space out proximate display film 30 to adapt to the increased length introduced by hinge rotation.

Referring now to FIGS. 11A and 11B, a side cutaway view depicts an example embodiment that biases display frame movement in response to rotation about a hinge 14. OLED display film 30 is susceptible to warpage and distortion if excessive force operates on it. In some instances, friction and/or torsional forces may result as display frame 32 slides relative to housing portion 12. In order to minimize the impact of such forces on display film 30 structural integrity, biasing forces are introduced to display frame 30 relative to housing portion 12 so that uneven forces across display film 30 do not result in damage. In the example embodiment depicted by FIG. 11, a biasing device 64 couples to display frame 32 on one end and an anchor 66 of a housing portion 12 across hinge 14 so that rotational movement at hinge 14 from the closed configuration to a planar configuration pulls through biasing device 64 on display frame 32 to bias display frame 32 to move towards hinge 14. The biasing force introduced by biasing device 64 works in cooperation with relative motion induced between display frame 32 and housing portion 12 by rotation about hinge 12.

In the example embodiment, biasing device 64 is a simple cable or wire that is pulled upon as a consequence of rotation about hinge 14 towards the planar configuration. In alternative embodiments, other types of biasing devices may be used to induce force in the direction of a sliding motion. For example, sensors 68, such as Hall sensors disposed proximate magnets on opposing housing portions, detect motion and introduce bias in response. As another example, sensors in hinge 14 may detect hinge movement, touch sensors at display 30 may detect a touch and even pressure introduced by an end user, and/or ambient sensors integrated in information handling system 10 may detect placement of a hand on a display or housing portion. Bias may be introduced with release of tension of a spring, a signal to a solenoid or other similar devices. In one example embodiment, the amount of bias provided by one or more biasing devices may regulated to neutralize any uneven movements detect for a display film 30 across the dimensions of a housing. Bias as illustrated by the example embodiment is introduced with a pulling action from anchor 66, however, in alternative embodiments bias may be introduced with a pushing action. Further, in order to maintain an even force, pushing and/or pulling may be introduced across the display structure. By focusing introduction of biasing forces at the underlying display frame, stresses related to movement of the display frame relative to the housing portion are diverted from OLED display film 30. As an alternative or in addition to biasing forces at display frame 32, pushing and pulling biasing force may be introduce to the underlying housing portion.

Referring now to FIGS. 12A and 12B, side lower and upper perspective views depict an information handling system 10 with multiple biasing devices 64. In the example embodiment, multiple anchored springs coupled to housing portion 12 extend to connect with roller edge cover 40 to provide a biasing of the display frame to slide relative to housing portion 12. For example, roller edge cover 40 includes a spindle or rotating cylindrical element that interacts with biasing devices 40 to translate a sliding biasing force to display frame 32. In one embodiment, constant biasing forces in both sliding directions are provided and selectively released by a spindle in roller edge cover 40, such as with a microcontroller executing embedded code and receiving sensor information that indicates likely sliding directions. Introducing a bias in the direction of an end user initiated sliding motion shifts the stress away from OLED flexible film 30 and to the display frame that supports the film.

Figure 13A:
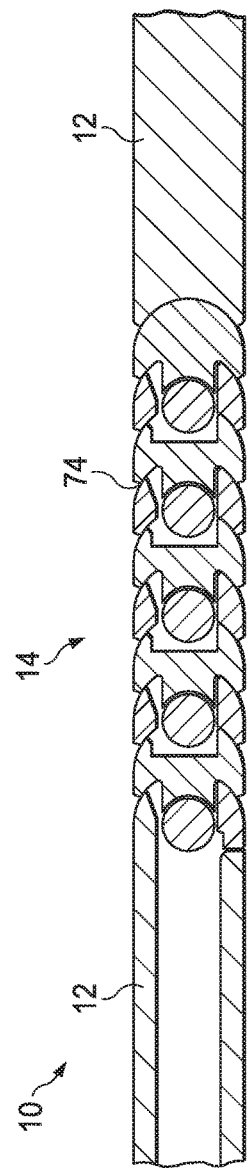
FIGS. 13A, 13B and 13C depict an alternative hinge structure that offers regulated display movement with minimal gaps between hinge elements.
Figure 13C:
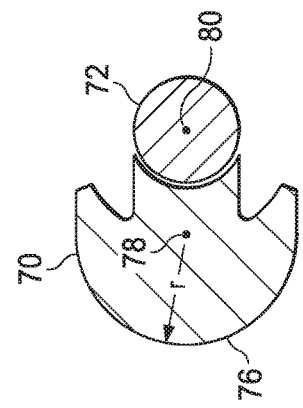
Figure 13B:
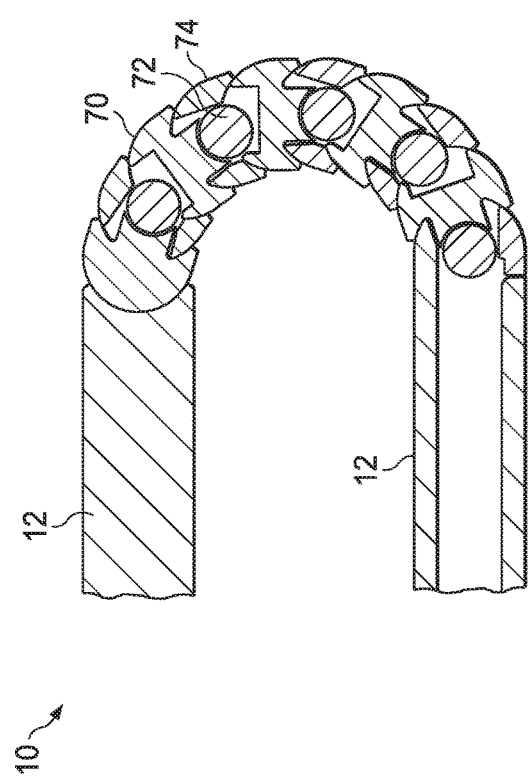

Referring now to FIGS. 13A, 13B and 13C, an alternative hinge structure is depicted that offers regulated display movement with minimal gaps between hinge elements. Gaps between hinge elements detract from physical appearance and also provide a pathway to introduce contaminants into an information handling system housing. FIG. 13A depicts first and second housing portions 12 of an information handling system 10 held in a planar configuration by a hinge 14 built from plural link elements 70 rotationally coupled by plural coupling elements 72. FIG. 13B depicts the link elements 70 rotated relative to each other about an axis defined by the coupling elements 72 to orient housing portions 12 to a closed configuration. FIG. 13C depicts details relating to the construction and interaction of the link elements 70 based upon rotation about the coupling elements 72. Each link element 70 has a front face with an arc curvature surface 76 as illustrated by FIG. 13C that fits into a cavity of an adjoining link element 70. The interaction between the link elements is guided by engagement of arc surface 76 with a symmetrically opposed cavity surface about a central point 78. In the example embodiment, a circle extending around link element 70 based upon the curvature of arc surface 76 does not extend into coupling element 72. In alternative embodiments, the relationship of the center point of link element 70, the circle defined by arc radius 76 and the rotation axis of coupling element 72 may vary to achieve desired rotational interactions as described below. For example, the distances between central point 78 and pivot point 80 may be shifted towards or away from outer arc surface 76 to achieve desired rotational interactions.

In the planar configuration depicted by FIG. 13A and the closed configuration depicted by FIG. 13B, an intersection 74 is defined between link elements 70 that limits the presence of a gap between link elements 70. The size of intersection 74 is managed in part by the interaction of arc surface 76 with a cavity formed on the back side of link element 70. For example, the backside of arc 76 tapers in a perpendicular manner to increase engagement at the cavity in the backside of link element 70. The size of intersection 74 is further managed by the relative location of pivot point 80 of coupling element 72 behind the rotational engagement of arc surface 76 with the adjacent link element 70 cavity. The resulting modular hinge assembly 14 provides a balance and stable movement of a flexible display film disposed over hinge 14. The hinge modules readily assemble to each other and can include sufficient torque within the hinge structure so that dedicated friction devices are minimized or avoided. In one alternative embodiments, more specific and varied hinge curvature relationships may be defined by providing different arc radius and pivot point distances at different hinge elements assembled to form the hinge.

Figure 14:
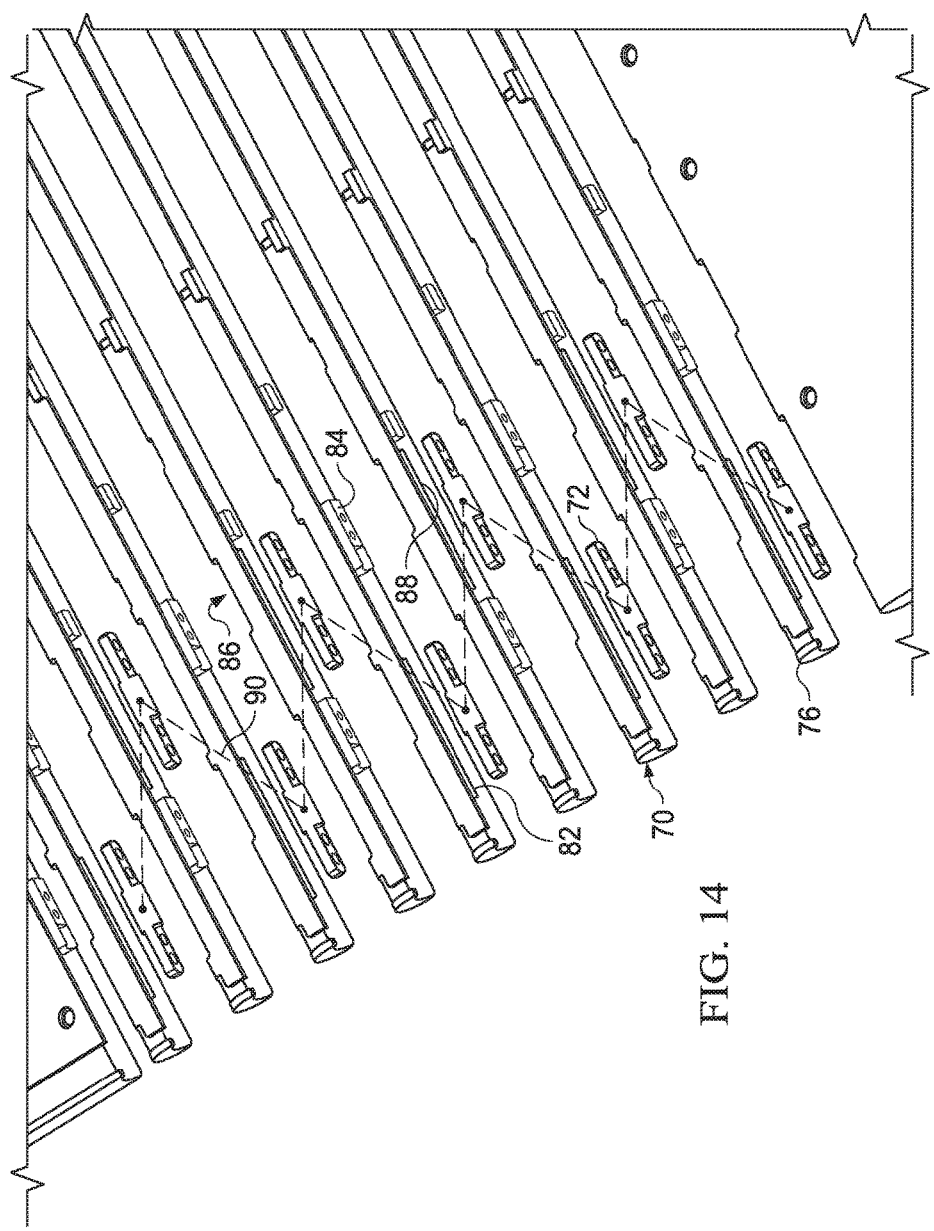
FIG. 14 depicts a zig zag pattern of setback coupling elements that reduce hinge size and improve hinge assembly.

Referring now to FIG. 14, a zig zag pattern depicts setback coupling elements that reduce hinge size and improve hinge assembly. Plural link elements 70 are shown in an expanded view aligned so that arc faces 76 couple into cavities 82 to form the hinge assembly 14. Coupling elements 72 attach link elements 70 together by coupling to a raised mount 84 and a cavity mount 88. Raised mount 84 inserts through a mount opening 86 of an adjacent link element 70 so that a coupling element 72 coupled to a cavity mount 88 and an inserted raised mount 84 holds the link elements 70 together with arc face 76 inserted into cavity 82. Mount openings 86 form a zig zag pattern 90 for the installation of coupling elements 72 to reduce the size of the hinge elements and simplify assembly of link elements 70. As is depicted by FIG. 14, the pivot point of coupling elements 72 defines the pivot point of link elements 70 behind the arc 76 defined curvature so that the hinge elements outer arc surface is rolled following arc 76 of the adjacent hinge module, reducing gaps introduced by rotation of the hinge where the link elements 70 meet.

Figure 15:
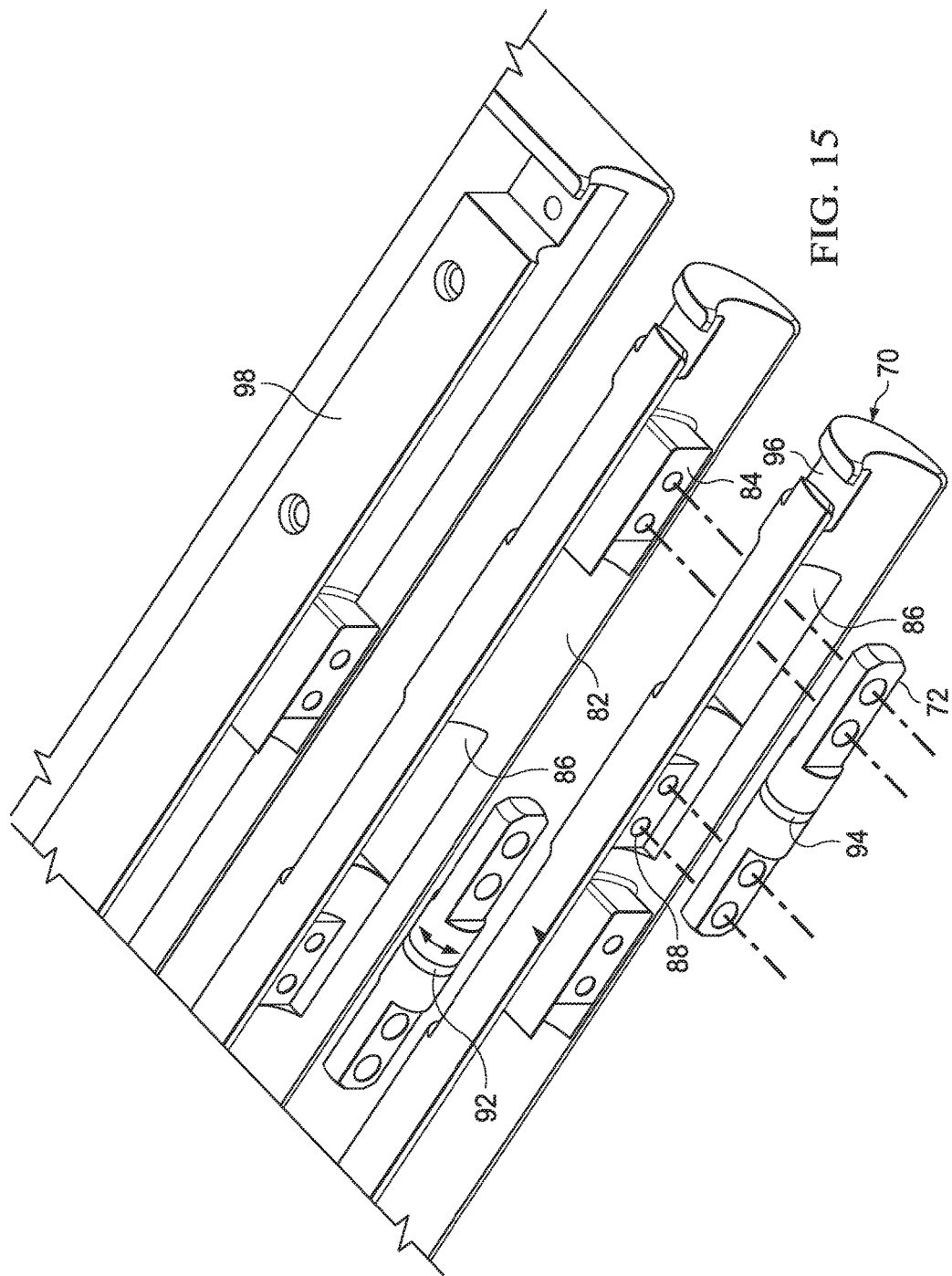
FIG. 15 depicts a rear perspective expanded view of hinge 14 interactions of coupling element pivot elements to manage link element interactions.

Referring now to FIG. 15, a rear perspective expanded view of hinge 14 depicts interactions of coupling element 72 pivot elements to manage link element 70 interactions. Each coupling element 72 includes a rotational break 92 about which opposing ends of coupling element 72 rotate. A friction element 94 disposed between rotating portions of coupling element 72 provides torque management for hinge 14, such as to maintain hinge 14 in desired rotational positions. For example, friction elements 94 are flat washers compressed against each other to resist rotation. By having friction elements inserted in coupling element 72 perpendicular to the axis of rotation, a larger surface is available for generating a desired level of friction, thus allowing a reduced wear over time and less stringent friction material selection. Integrating the friction material within coupling element 72 provides more convenient assembly and more consistent torque across the hinge during rotational movement. A hinge block 98 integrated with the information handling system housing portion 12 provides mounting block 84 to couple with hinge 14. In addition, a cable path 96 formed in each link element 70 assembles to define a cable path between the housing portions 12. Managed rotational relationships of link elements 70 based upon the backwards offset of coupling elements 72 keeps cable path 96 open between the link elements 70 to guide and protect cables traversing between the housing portions 12.

Figure 16:
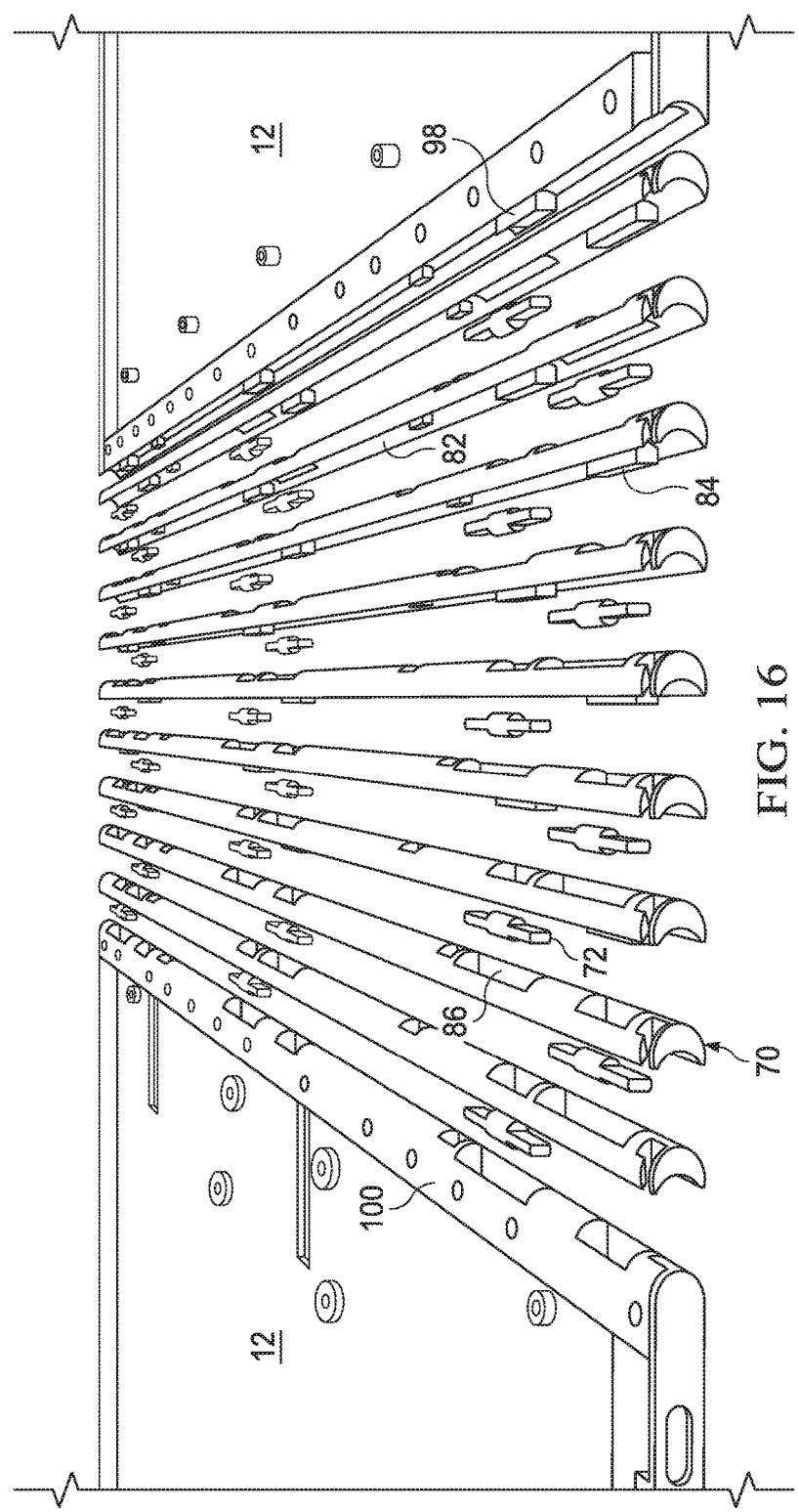
FIG. 16 depicts a side upper perspective expanded view of link elements and coupling elements aligned for assembly between housing portions.
Figure 17:
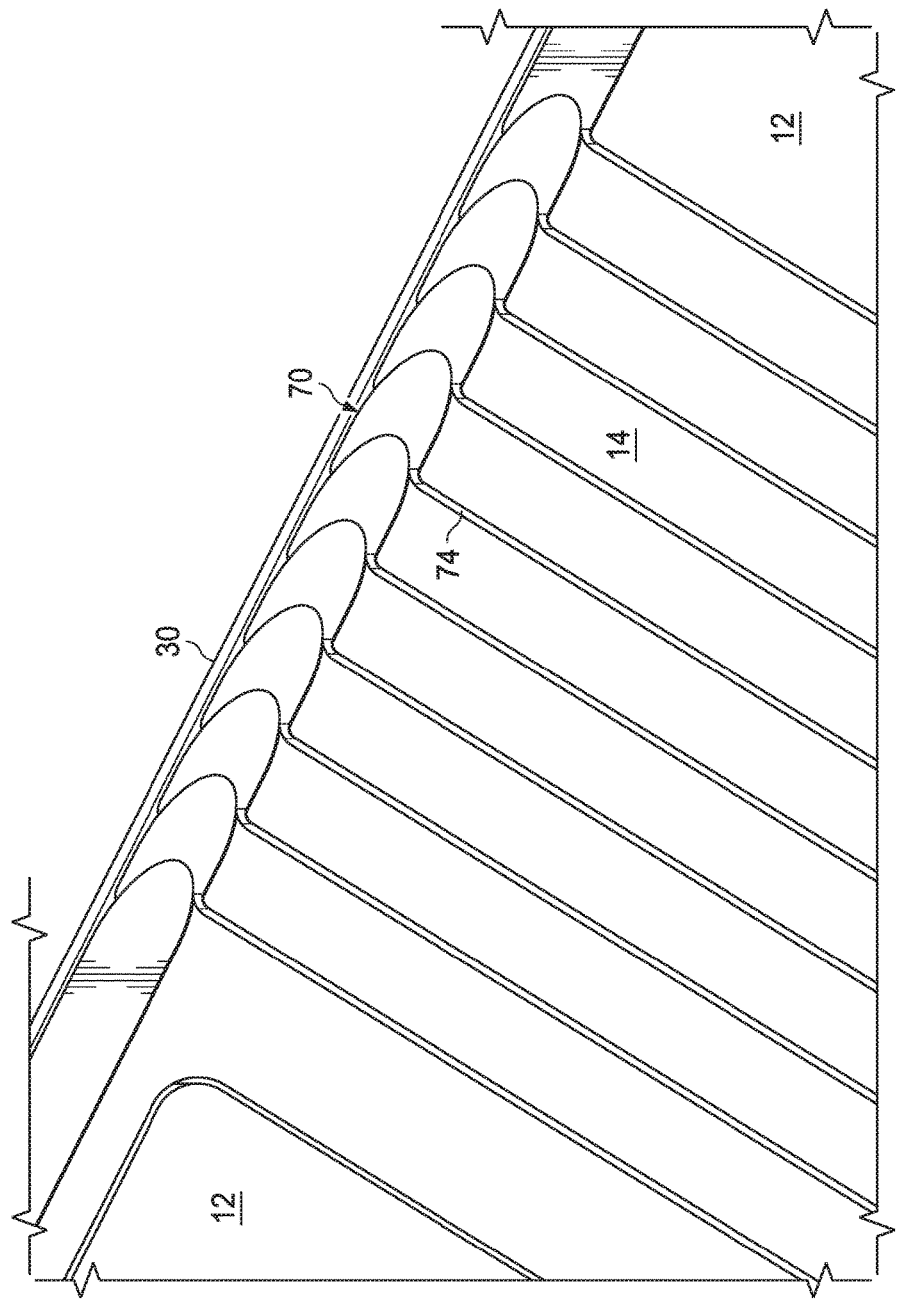
FIG. 17 depicts a bottom side perspective view of the hinge assembled from interconnected link elements.

Referring now to FIG. 16, a side upper perspective expanded view depicts link elements 70 and coupling elements 72 aligned for assembly between housing portions 12. A base 98 integrated with one housing portion 12 includes a mounting face to couple with an adjacent link element 70. A base 100 on the opposing housing portion 12 exposes an arc face to engage with a link element cavity and openings to interface coupling elements 72. Once hinge 14 is assembled to rotationally couple the housing portions to each other, a flexible support 34 may provide additional support to an OLED display film disposed over hinge 14. FIG. 17 depicts a bottom side perspective view of the hinge 14 assembled from interconnected link elements 70. OLED display film 30 is disposed over hinge 14 on the upper side of the housing. Intersections 74 provide minimal gap between hinge elements for a graceful and secure assembly.

Figure 18B:
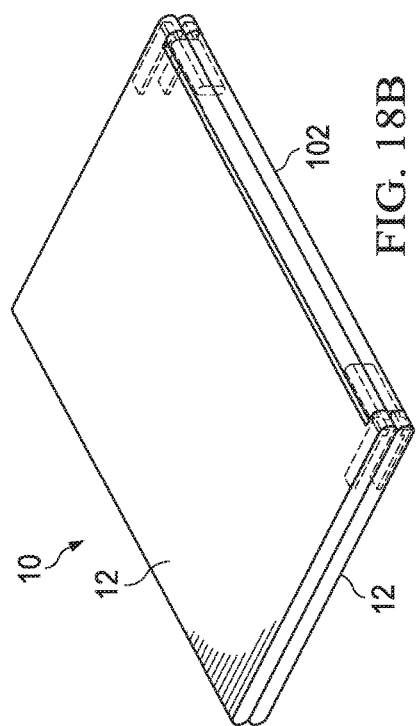
FIGS. 18A, 18B and 18C depict an information handling system having a flexible display disposed over a dual axis hinge.
Figure 18C:
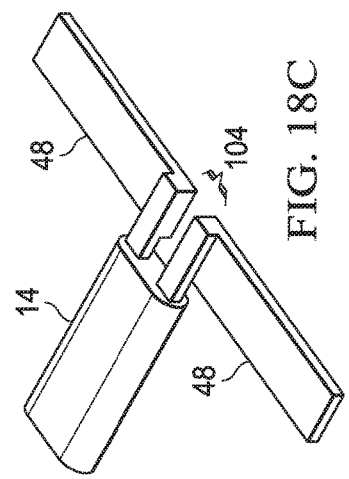
Figure 18A:
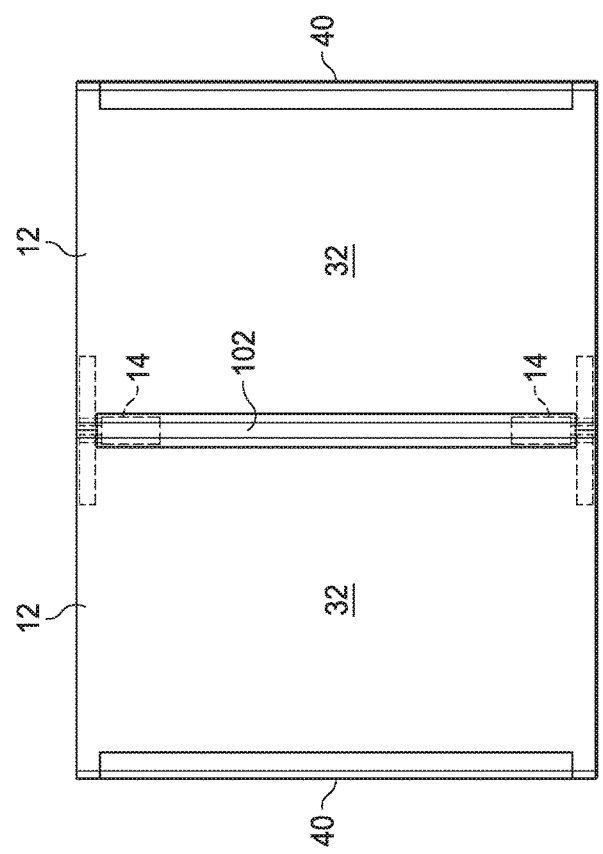

Referring now to FIGS. 18A, 18B and 18C, an information handling system having a flexible display disposed over a dual axis hinge is depicted. In the example embodiment, housing portions 12 rotationally couple with a dual axis hinge 14, such as that depicted by FIG. 18C, to rotate between the planar configuration depicted by FIG. 18A and the closed configuration depicted by FIG. 18A. A hinge housing 102 couples between hinges 14 at opposing ends of housing 12 to provide an intermediate solid surface between the two housing portions 12. A distance 104 between axles 48 defines the width across hinge housing 102. As depicted in FIG. 18A, hinge housing 102 provides a flat intermediate surface between display frames 32 that supports a display film 30 disposed across display frames 32. Roller assemblies 40 on opposing sides of housing portions 12 manage movement of the display frame structure. As depicted in FIG. 18B, hinge housing 102 stands perpendicular to housing portions 12 to provide a curve radius for OLED display film 30 defined by the distance 104 between the rotational axes of hinge 14 axles 48.

Referring now to FIGS. 19A and 19B, rotation of information handling system 10 housing portions 12 between closed and planar configurations about a dual axis hinge 14 is depicted. FIG. 19A depicts housing portions 12 rotated to a closed position about hinge 14 so that the distance 104 between axles 48 define a bend radius 106 for OLED display film 30. A display frame structure maintains a position of OLED display film 30 relative to hinge housing 102 with an interconnect bar 36 fixedly coupled to a flexible support 34 disposed across hinge housing 102. The display frame structure includes flexible support 34 fixedly coupled to display frames 32 that slide relative to housing portions 12. Display frames 32 and flexible support 34 provide a support to OLED display film 30 that prevents excessive bends of film 30 that could damage the OLED film material. As set forth above, flexible support 34 is a material selected that maintains a bend radius when folded and has resilient characteristics to retain a flat surface when unfolded. One example of a material for flexible support 34 is a shape memory alloy, such as a nickel titanium alloy treated for super elasticity. Another example is a thin sheet of stainless steel, although other materials with similar characteristics can be used. The bend radius is adapted through selection of the material for flexible support 34 and selection of a dual axis hinge 14 that has desired spacing 104 between axles 48. FIG. 19B illustrates that rotation of housing portions 12 about hinge 14 to the planar configuration results in flexible display 30 disposed in a flat configuration across flexible support 34 and display frame 32. Interconnect bar 36 fixes flexible support 34 in the relative position to hinge housing 102 between the closed and planar configurations. In the example embodiment, interconnect bar 36 has a 'T' shape with a flat upper surface that fixes to flexible support 34 and an inner portion embedded within hinge housing 102.

Figure 20A:
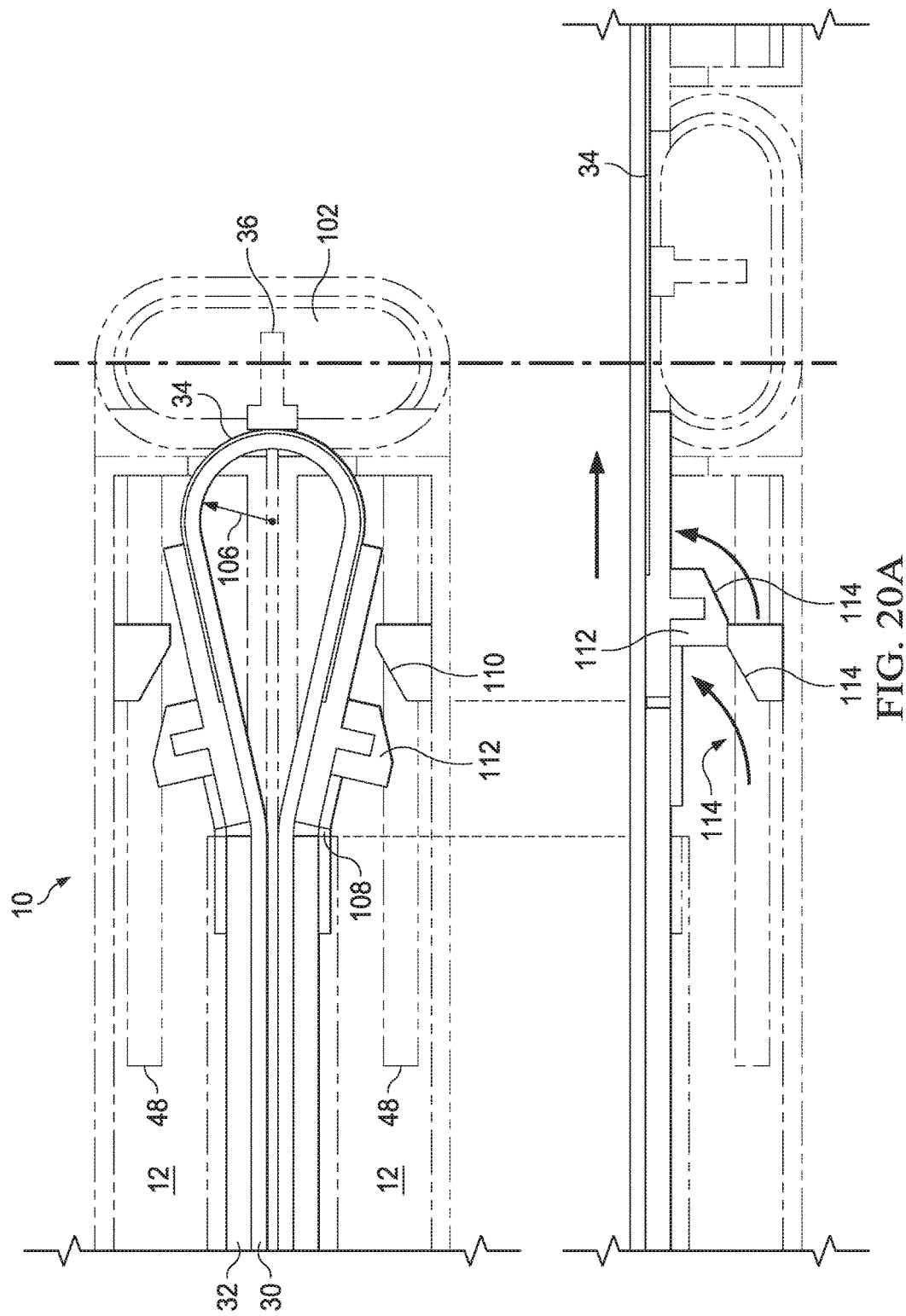
FIGS. 20A and 20B depict display film bend radius management enhanced with ramp structure engagement that provides space efficient housing portion arrangement in the closed configuration.
Figure 20B:
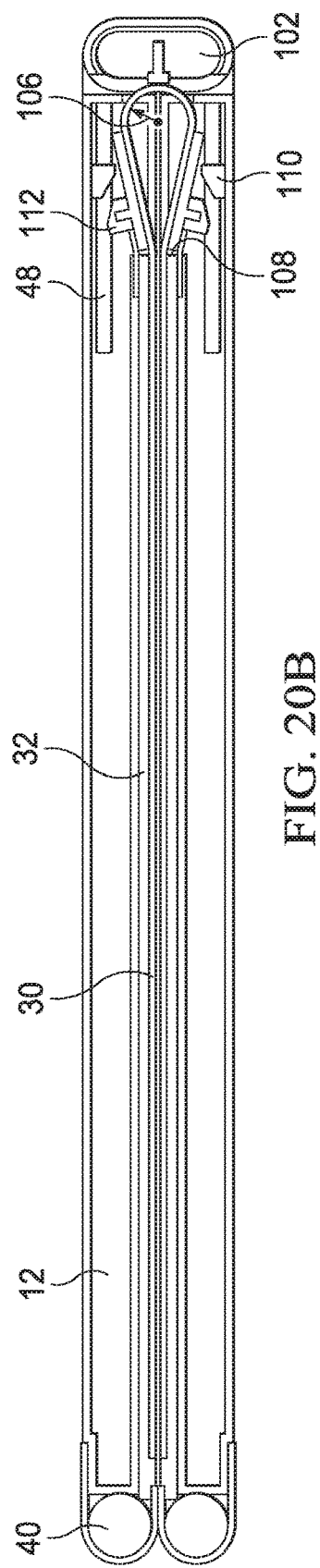

Referring now to FIGS. 20A and 20B, display film 30 bend radius 106 management is enhanced with ramp structure engagement that provides space efficient housing portion 12 arrangement in the closed configuration. In the closed configuration, housing portions 12 close to a substantially parallel arrangement defined by the distance between axles 48 of hinge 14. In order to achieve a minimal separation of housing portions 12 in the closed configuration, a display frame soft link 108 formed in each display frame introduces an additional bend radius of display film 30 in an opposite direction of bend radius 106. As housing portions 12 approach the closed position, soft link 108 bends slightly allowing display film 30 between soft link 108 and roller assembly 40 to lie substantially parallel on opposing housing portions 12. In the planar configuration, soft link 108 is reinforced by a ramp structure that holds OLED display film 30 in a supported planar configuration. In the example embodiment, a display frame ramp 112 slides relative to a housing portion ramp 110 during rotation of the housing portions 12 to engage as depicted by arrows 114, resulting in the supported planar configuration of display film 30 as illustrated by FIG. 20A. Ramp structure 110 and 112 releases soft link 108 of display frame 32 as housing portions 12 rotate from the planar to the closed configurations so that display film 30 folds at soft link 108 to provide parallel display film 30 disposition.

In the example embodiment, display frame ramp 112 and housing portion 110 have a flat portion that aligns in the planar configuration to lock soft link 108 in a planar configuration. In addition display frame ramp 112 and housing ramp 110 have opposing ramped surfaces 114 that selectively engage during intermediate rotational positions of housing portions 12 to provide desired support to display film 30. As display frame 32 slides relative to housing portion 12, opposing ramp surfaces 114 engage to gradually allow folding at soft link 108. As an example, when housing portions 12 rotate to a perpendicular orientation, such as a clamshell configuration having a part of the display available as a virtual keyboard, some folding at soft link 108 may be acceptable since the portion of display film 30 proximate bend radius 106 is less likely to be used for touch inputs. The degree of rotation at which soft link 108 folds is determined by the interaction of ramps 112 and 114 relative to the amount sliding that display frame 32 has as housing portions 12 rotate. The example embodiment of FIG. 20A depicts a total sliding distance of approximately twice to length of structures 110 and 112, however in other embodiments other types of structural relationships may be used. Although the example embodiment depicts a mechanical ramp structure that controls soft link 108 by relative sliding motion, in alternative embodiments, sensors that track the relative rotational orientation of the housing portions may be used to release soft link 108 at exact rotational relationships. For example, a sensor may trigger a solenoid or other device that selective locks and releases soft link 108 at desired housing portion 12 rotational relationships.

Figure 21A:
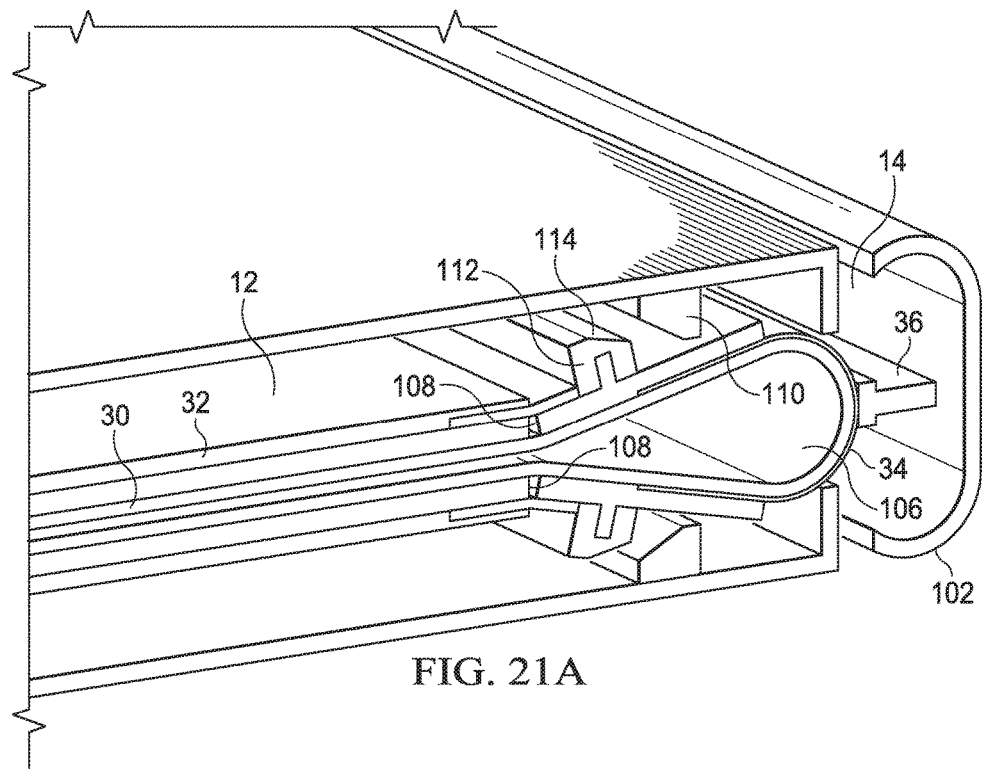
FIGS. 21A and 21B depict a side perspective view of an information handling system in closed and planar configurations with secondary folds in the display film to aid full collapse of the housing portions in the closed configuration.
Figure 21B:
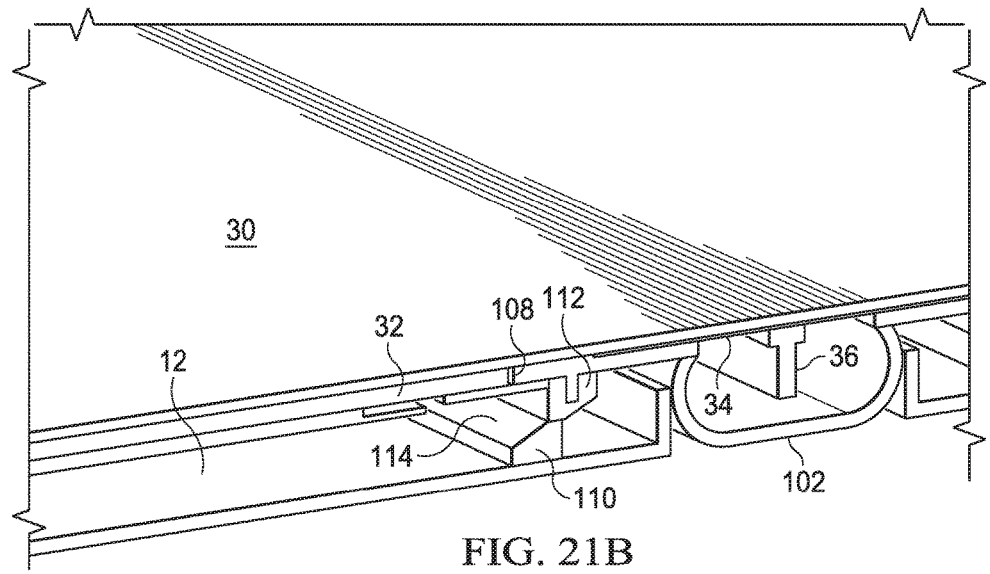

Referring now to FIGS. 21A and 21B, a side perspective view depicts information handling system 10 in closed and planar configurations with secondary folds in display film 30 to aid full collapse of housing portions 12 in the closed configuration. As illustrated in FIG. 21A, the secondary fold in display film 30 at soft link 108 provides a closed configuration in which display film 30 past soft link 108 has a substantially parallel disposition. The more compressed closed configuration includes an area within housing portions 12 to allow space for bend radius 106. In the planar configuration depicted by FIG. 21B, engagement of the ramp structures 110 and 112 provide support underneath display frame 32 that holds display 30 in a planar configuration so that an end user may make touch inputs against a flat display surface without inducing damage at display film 30.

Figure 22A:
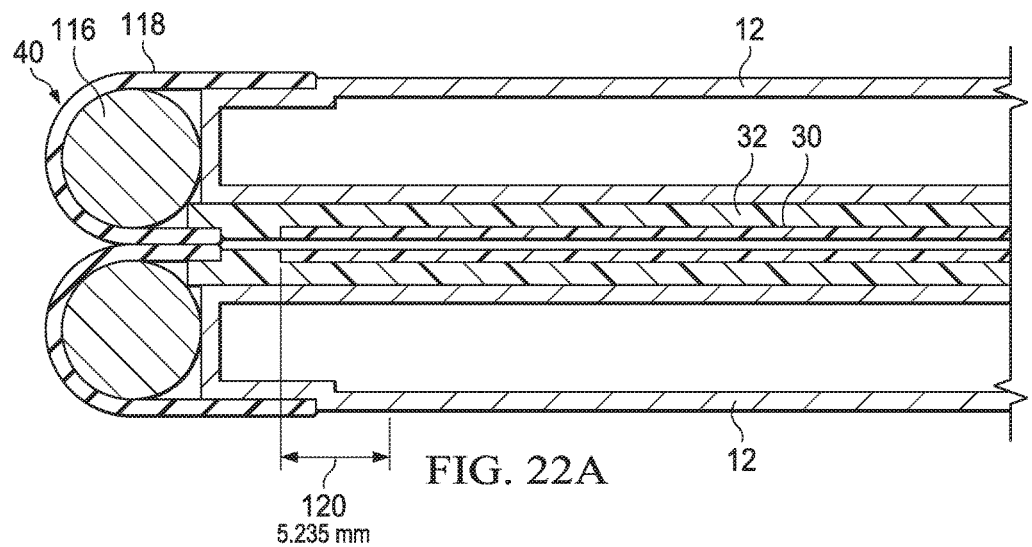
FIGS. 22A and 22B depict a side cutaway view of an example embodiment of a roller assembly in closed and planar configurations that aids management of display frame structure sliding relative to housing portions.
Figure 22B:
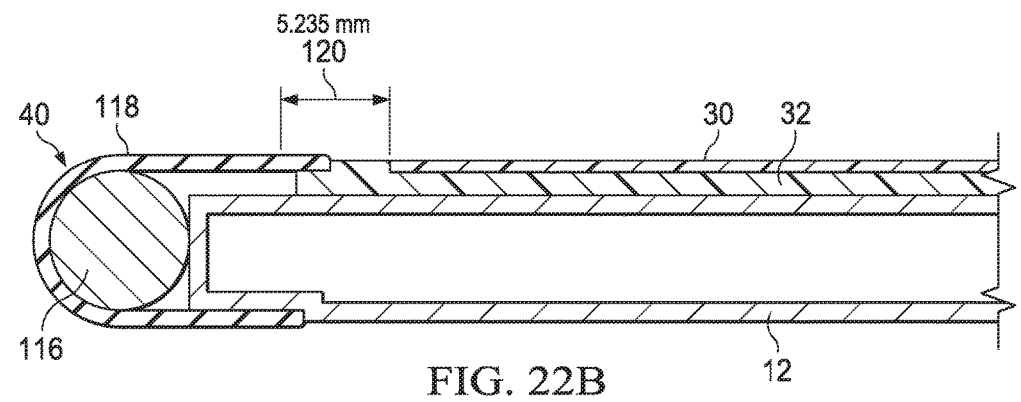

Referring now to FIGS. 22A and 22B, a side cutaway view depicts an example embodiment of a roller assembly 40 in closed and planar configurations that aids management of display frame structure sliding relative to housing portions 12. Roller assembly 40 includes a spindle 116 having a cylindrical shape and free to rotate at the end of housing portion 12. A soft cover 118 is disposed over spindle 116 and coupled at opposing ends to housing portion 12 and display frame 32. As housing portions 12 rotate relative to each other from the closed configuration of FIG. 22A to the planar configuration of FIG. 22B, cover 118 moves with spindle 116 to adapt to sliding of display frame 32 relative to housing portion 12, such as with 5.235 mm of distance 120 in the example embodiment. In the example embodiment, soft cover 118 is a flexible material, such as silicon TPU film, that stretches in response to the lateral force introduced by relative display frame 32 movement as housing portions rotate to the planar configuration. For example, in the example embodiment, cover 118 has a length of 23.12 mm in the closed configuration and 26.59 mm in the planar configuration. The force for stretching cover 118 operates against display frame 32 motion to provide a bias from the planar to a closed position. In alternative embodiments, alternative covers 118 may slide with roller spindle 116 rather than stretch, such as by have a coupling to housing portion 12 that allows movement of cover 118 as spindle 116 rotates.

Figure 23:
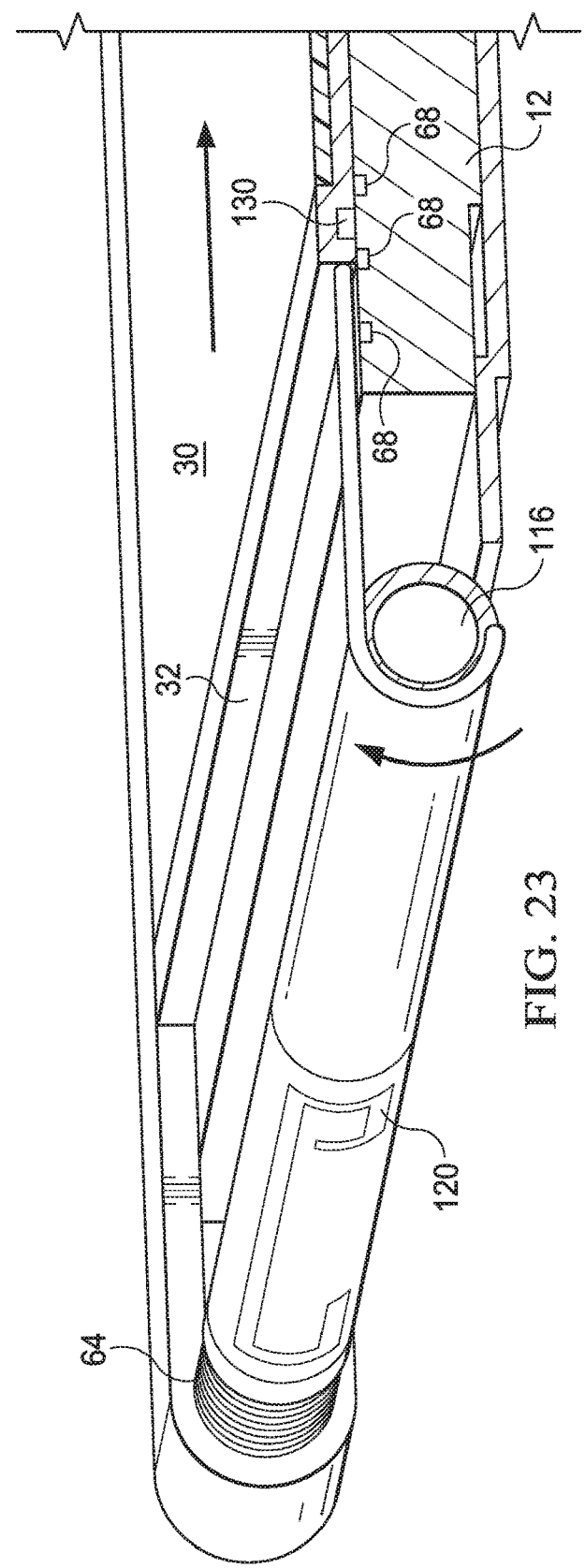
FIG. 23 depicts a side cutaway view of a roller edge having an integrated biasing device and antenna.

Referring now to FIG. 23, a side cutaway view depicts roller edge 40 having an integrated biasing device 64 and antenna 120. In the example embodiment, biasing device 64 is a tension spring disposed over spindle 116 that pulls display frame 32 away from hinge 14 by biasing spindle 116 to rotate counterclockwise. As housing portion 12 rotates from the closed to the planar configuration, tension builds on spring 64 to rotate spindle 116 and draw display frame 32 back towards roller edge 40. By operating on display frame 32, biasing device 64 reduces torsional forces that can potentially damage display film 30 during transition to the closed configuration. Antenna 120 integrates in spindle 116 to provide wireless signal communication in an orientation determined from the rotational position of spindle 116. Advantageously, rotation of antenna 120 at spindle 116 tends to maintain antenna 120 at approximately the same distance to display film 30 as display frame 32 slides relative to the end of housing portion 12. OLED display film 30 can introduce RF noise that impacts performance of antenna 120. By rotating antenna 120 with spindle 116, the relative position of antenna 120 to display film 30 remains the same, meaning that the RF impact of noise generated by display film 30 does not change relative to antenna 120 so that minimal or no antenna tuning is needed to adapt to position movement of display film 30 relative to antenna 120, even if some slight distance changes do occur.

In one alternative embodiment, biasing device 64 includes first and second torsional springs wrapped around spindle 116 and configured to bias display frame 32 in opposite directions. Position sensors 68, such as Hall sensors aligned with a magnet 130 detects relative motion of display frame 32 and housing portion 12 so that a bias in the direction of sliding motion is applied to display frame 32. For example, a controller with embedded code and a stepper motor or similar device may control the application of a biasing force in the direction of a sliding motion by adjusting tension on spring biasing device 64. Advanced logic in information handling system 10, such as logic operating on an embedded controller or as part of system BIOS, may predict sliding movement by predicting end user rotation of housing portions 12. When a sliding motion is predicted, bias applied to display frame 32 in the direction of the sliding motion reduces the risk that torsional forces or uneven sliding motion will warp or otherwise damage display film 30.

Figure 24:
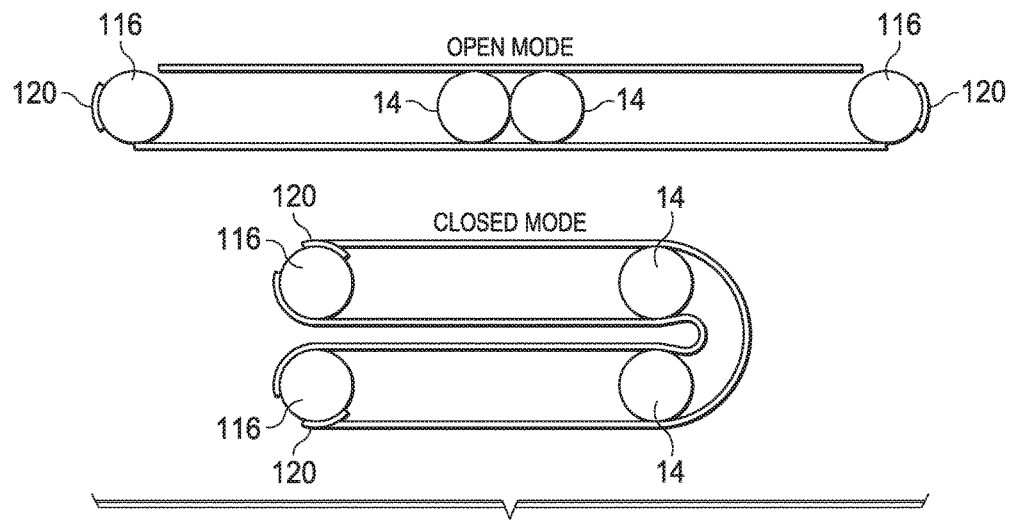
FIG. 24 depicts changing orientations of antennae as the spindles rotate to manage display film position.

Referring now to FIG. 24, changing orientations of antenna 120 is depicted as spindles 116 rotate to manage display film 30 position. In the open position, antenna 120 each direct radio energy in opposite directions away from OLED display film 30. Locating antenna 120 at opposing ends of information handling system 10 enhances wireless communication by providing a communication path to external wireless devices, such as a wireless access point (WAP), which does not transverse OLED display film 30. In the closed position, both antenna 120 rotate to the outer face of information handling system 10, again offering a wireless communication path that does not transverse OLED display film 30 by selecting the antenna 120 closest to the external wireless device. In an alternative embodiment, multiple antenna 120 may be disposed at various positions of spindle 116 so that at various rotational orientations a preferred antenna is available for different types and directions of wireless communication. For example, in one alternative embodiment, antenna of different spindles align in the closed position so that directional wireless communication is achieved, such as with a pair of antenna on opposite spindles brought into proximity by rotation to the closed position that establish a phase array antenna. By locating antenna at various rotational positions of spindle 116 relative to OLED display film 30, a constant distance between the antenna and display film is maintained for consistent RF performance.

Figure 25:
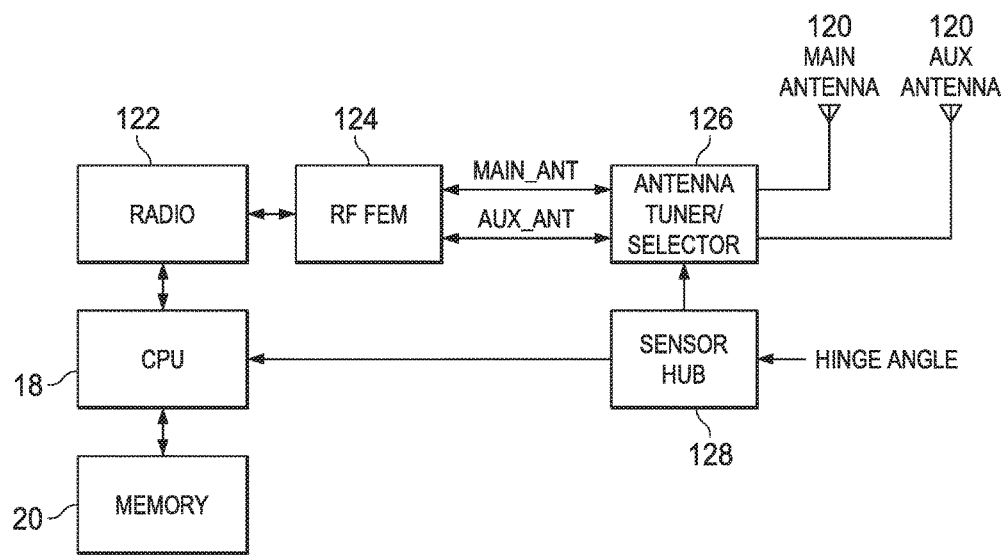
FIG. 25 depicts a block diagram of an information handling system having antenna selection based on spindle orientation.

Referring now to FIG. 25, a block diagram depicts an information handling system 10 having antenna 120 selection based on spindle 116 orientation. A radio 122 interfaces with a CPU 18 to support RF communication, such as with a wireless local area network (WLAN), wireless wide area network (WWAN) and/or wireless personal area network (WPAN). Radio 122 formats wireless communications through an RF front end module 124 as a main or auxiliary antenna interface. An antenna tuner/selector 126 directs wireless communications to the selected of the main or auxiliary antenna 120. A sensor hub 128 receives sensor inputs that indicate the orientation of the antenna 120, such as by association to a detected hinge angle. As housing portions rotate between open and closed modes, detected orientations provided by sensor hub 128 are applied at antenna tuner/selector 126 to direct wireless communication through the antenna 120 having a desired orientation.

Figure 26:
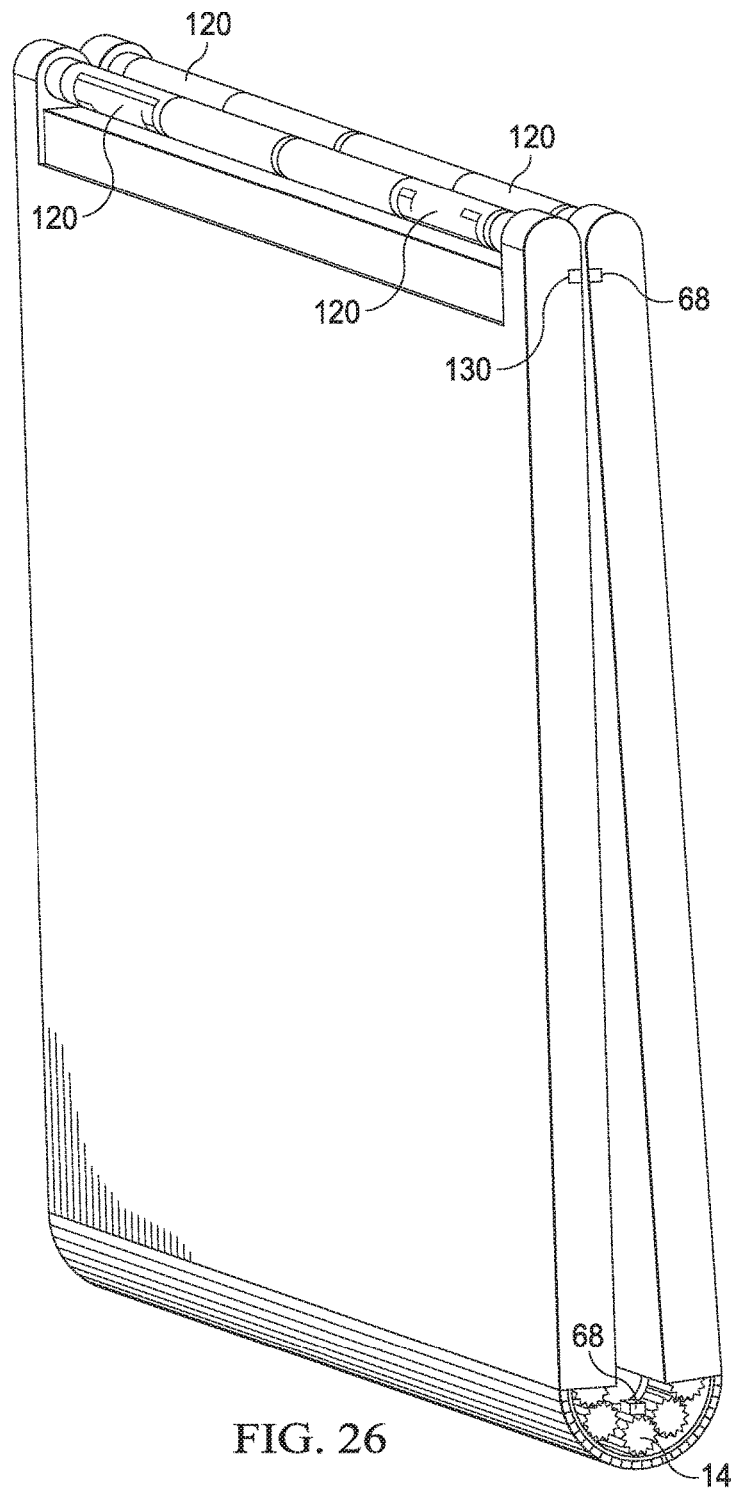
FIG. 26 depicts an information handling system in a closed position having antennae disposed on a spindle that support phased array wireless signal communication.

Referring now to FIG. 26, an information handling system in a closed position is depicted having antenna 120 disposed on a spindle 116 that support phased array wireless signal communication. In the example embodiment, two antenna integrated on the same spindle 116 have inverse orientations of the transmission length portion. In addition, two additional antenna are disposed on the spindle 116 of the opposite housing portion. Wireless communication from information handling system 10 may be performed selectively with one antenna on one spindle that provides the best signal to noise ratio to the external radio of interest. As an alternative, directive transmissions may be accomplished by cooperatively applying RF energy to antenna 120 on opposing housing portions 12. Detection of the housing position by a sensor 68 provides logic inside the radio structure with relative antenna orientation to determine the best communication mode. For example, rotation of the housing portions to the closed configuration as depicted in FIG. 27 provides antenna 120 orientation through rotation of spindles 116 that directs RF energy in directions opposite each other and away from display film 30.

Figure 27:
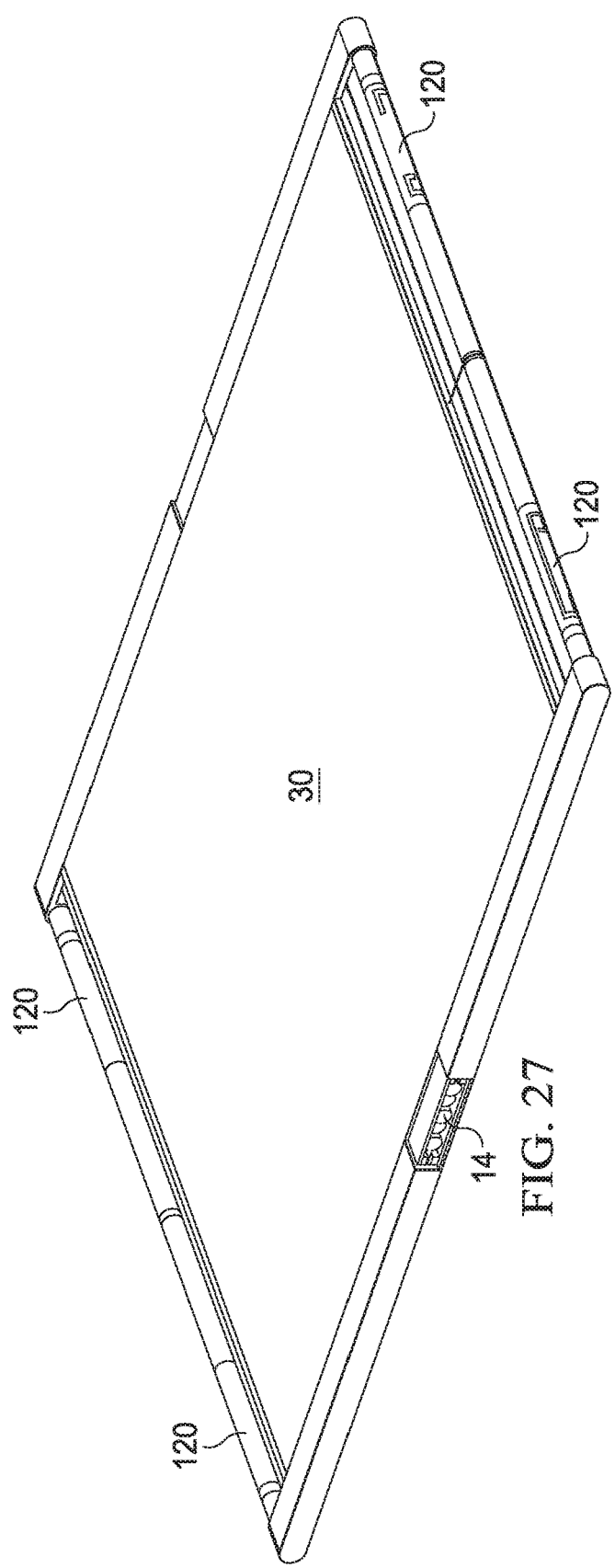
FIG. 27 depicts an information handling system in an open position having antenna on opposing sides of housing portions 12 to support wireless communication distal a flexible display film.

Referring now to FIG. 27, an information handling system in an open position depicts antenna on opposing sides of housing portions 12 to support wireless communication distal a flexible display film 30. In the planar configuration, spindles 116 rotate antenna 120 to a side orientation at each of opposing ends of housing portions 12 so that RF energy transverses to external wireless devices from each end without passing by display film 30.

Although the present invention has been described in detail, it should be understood that various changes, substitutions and alterations can be made hereto without departing from the spirit and scope of the invention as defined by the appended claims.

What is claimed is:

1. An information handling system comprising:
first and second housing portion;
processing components disposed in at least one housing portion, the processing components cooperating to process information;
a dual axes hinge rotationally coupling the first and second housing portions between a closed configuration and a planar configuration, the hinge having a housing that supports first and second axes spaced by set distance; and
a flexible display structure disposed over the first and second housing portions, the flexible display structure having a first display frame slidingly engaged with the first housing portion, a second display frame slidingly engaged with the second housing portion, a flexible support disposed between the first and second display frames and an OLED film disposed over the first and second display frames; and
an interconnect bar fixed to the hinge between the two axes and fixed to the flexible support between the two display frames, the interconnect bar maintaining the OLED film in a fixed position relative to the dual axes hinge during rotation of the housing portions.

2. The information handling system of claim 1 wherein the flexible support comprises a shape memory alloy that manages OLED film bend radius in the closed configuration and provides support under the OLED film in the open configuration.

3. The information handling system of claim 2 wherein the shape memory alloy comprises nickel titanium.

4. The information handling system of claim 1 wherein the flexible support comprises stainless steel.

5. The information handling system of claim 1 wherein each display frame comprises a soft link disposed proximate the hinge, the soft link providing bending of the display frame as the housing portions rotate to the closed position.

6. The information handling system of claim 5 further comprising a first planar configuration support disposed at a fixed location relative to the first housing portion and aligned to engage the first display frame proximate the soft link, the planar configuration support maintaining the first display frame as a planar surface with the housing portions rotate to the planar configuration.

7. The information handling system of claim 6 wherein the planar configuration support comprises a ramped surface that engages the first display frame as rotation of the housing portions towards the planar configuration slides the display frame towards the hinge.

8. The information handling system of claim 7 wherein the planar configuration support comprises opposing ramped surfaces, a first ramped surface fixed in position relative to the first housing portion, the second ramped surface fixed in position relative to the display frame.

9. The system of claim 1 further comprising a biasing device interfaced with at least one of the display frames and biasing the interfaced display frame to slide in coordination with rotation of the housing portions.

10. A method for rotationally coupling information handling system housing portions having a flexible display, the method comprising:
coupling a first housing portion to a first axis of a dual axis hinge;
coupling a second housing portion to a second axis of the dual axis hinge;
coupling a flexible planar support to a fixed position relative to the dual axis hinge;
disposing a flexible display over the first and second housing portions, the flexible display having a first frame support disposed at the first housing portion, a second frame support disposed at the second housing portion and an OLED film disposed over the first and second frame supports; and managing a bend radius of the OLED film by bending the flexible planar support about its fixed position relative to the hinge, the bend radius defined in part by a distance between the first and second hinge axes.

11. The method of claim 10 wherein the flexible planar support comprises a shape memory alloy.

12. The method of claim 11 wherein the flexible planar support comprises a nickel titanium alloy.

13. The method of claim 10 wherein the flexible planar support comprises stainless steel.

14. The method of claim 10 wherein managing a bend radius further comprises:

flexing the first and second frame supports proximate the hinge as the housing portions rotate to the closed configuration; and bringing the OLED film of the first and second portions to a parallel alignment past the flex of the frame support in the closed configuration.

15. The method of claim 14 further comprising:

rotating the housing portions to a planar configuration;

engaging a first ramp structure of the first housing portion with the first display frame to maintain the first display frame in a planar configuration; and engaging a second ramp structure of the second housing portion with the second display frame to maintain the second display frame in a planar configuration.

16. The method of claim 15 wherein the hinge comprises a synchronized hinge.

17. A hinge comprising:

a hinge housing;

first and second axles extending from the hinge housing and configured to couple to first and second bodies, the first axle rotating the first body relative to the hinge housing, the second axle rotating the second body relative to the hinge housing;

a shaped metal alloy sheet fixed to the hinge housing to have a planar configuration between the first and second axles in an open location, the shaped metal alloy sheet configured to bend from the planar configuration to a folded configuration in response to transition of the first and second axles from the open to a closed position, the folded configuration adapted to support a desired flexible display film bend radius.

18. The hinge of claim 17 wherein the shape metal alloy comprises nickel titanium.

19. The hinge of claim 17 further comprising an interconnect bar having an upper surface welded to the shape metal alloy and a body coupled to the hinge housing.

20. The hinge of claim 17 further comprising:

a first display frame coupled to the shape metal alloy proximate the first axle and having a flexible joint;

a second display frame coupled to the shape metal alloy proximate the second axle and having a flexible joint; and first and second ramp structures coupled to the display frame proximate the first and second flexible joints and configured to engage a structure of the first and second bodies to support a planar disposition.

* * * * *